United States Patent
Lee et al.

(10) Patent No.: US 12,256,619 B2
(45) Date of Patent: Mar. 18, 2025

(54) DISPLAY DEVICE

(71) Applicant: Samsung Display Co., Ltd., Yongin-Si (KR)

(72) Inventors: Seon Uk Lee, Seongnam-si (KR); Hwa Yeul Oh, Hwaseong-si (KR); Seung Kil Yang, Cheonan-si (KR); Song Ee Lee, Seoul (KR); Yoo Seok Jang, Hwaseong-si (KR); Jeong Ki Kim, Hwaseong-si (KR); Jong Hoon Kim, Seoul (KR); Ju Yong Kim, Busan (KR); Ji Seong Yang, Suwon-si (KR); Jun Hwi Lim, Seoul (KR); Sang Yeon Hwang, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 647 days.

(21) Appl. No.: 17/483,487

(22) Filed: Sep. 23, 2021

(65) Prior Publication Data
US 2022/0199690 A1    Jun. 23, 2022

(30) Foreign Application Priority Data
Dec. 18, 2020  (KR) .................. 10-2020-0178202

(51) Int. Cl.
*H01L 27/32* (2006.01)
*H01L 51/52* (2006.01)
(Continued)

(52) U.S. Cl.
CPC ........... *H10K 59/38* (2023.02); *H10K 50/854* (2023.02); *H10K 59/12* (2023.02)

(58) Field of Classification Search
CPC ........... H10K 59/122; H10K 2102/351; H10K 59/12; H10K 59/127
See application file for complete search history.

(56) References Cited

U.S. PATENT DOCUMENTS

| | | | |
|---|---|---|---|
| 2014/0191216 A1* | 7/2014 | Matsumoto | ........ H10K 59/805 257/40 |
| 2016/0033823 A1 | 2/2016 | Lee et al. | |

(Continued)

FOREIGN PATENT DOCUMENTS

| | | | |
|---|---|---|---|
| CN | 111864101 | * 10/2020 | ......... H01L 27/3246 |
| EP | 3913683 A1 | 11/2021 | |

(Continued)

OTHER PUBLICATIONS

Extended European Search Report, Application No. 21215287.0, dated Apr. 29, 2022, 13 pages.

*Primary Examiner* — John A Bodnar
(74) *Attorney, Agent, or Firm* — Innovation Counsel LLP

(57) ABSTRACT

A display device is provided. A display device including a plurality of light-output areas through which incident light is emitted and a light-blocking area which blocks the incident light, the display device includes a substrate, a bank layer which is disposed in the light-blocking area on the substrate and defines a plurality of openings, each of which is disposed in one of the plurality of light-output areas, and a color control pattern disposed in the opening of the bank layer, wherein the bank layer includes a first bank area which has a first thickness and defines the plurality of openings and a second bank area which is disposed between the plurality of openings and has a second thickness smaller than the first thickness.

22 Claims, 15 Drawing Sheets

(51) Int. Cl.
  *H10K 50/854* (2023.01)
  *H10K 59/12* (2023.01)
  *H10K 59/38* (2023.01)

(56) References Cited

U.S. PATENT DOCUMENTS

| | | | | |
|---|---|---|---|---|
| 2019/0025634 | A1* | 1/2019 | Park | G02F 1/133377 |
| 2019/0067644 | A1* | 2/2019 | Choi | G06F 3/041 |
| 2019/0393286 | A1* | 12/2019 | Ding | H10K 59/60 |
| 2020/0373365 | A1 | 11/2020 | Kim | |
| 2021/0151528 | A1* | 5/2021 | Nan | H10K 59/173 |
| 2022/0415978 | A1* | 12/2022 | Huang | H10K 71/236 |

FOREIGN PATENT DOCUMENTS

| | | |
|---|---|---|
| EP | 3923338 A2 | 12/2021 |
| JP | 2006-072176 A | 3/2006 |
| KR | 10-2007-0049172 A | 5/2007 |
| KR | 10-1341225 B1 | 12/2013 |
| KR | 10-2016-0015480 A | 2/2016 |
| KR | 10-2016-0017373 A | 2/2016 |
| KR | 10-2018-0008950 A | 1/2018 |
| KR | 10-2018-0092326 A | 8/2018 |
| KR | 10-2062587 B1 | 1/2020 |
| KR | 10-2085912 B1 | 3/2020 |
| KR | 10-2020-0046449 A | 5/2020 |
| KR | 10-2020-0072745 A | 6/2020 |
| KR | 10-2223421 B1 | 3/2021 |

\* cited by examiner

DISPLAY DEVICE

CROSS-REFERENCE TO RELATED APPLICATIONS

This application claims priority from Korean Patent Application No. 10-2020-0178202 filed on Dec. 18, 2020, in the Korean Intellectual Property Office, and all the benefits accruing therefrom under 35 U.S.C. 119, the contents of which in its entirety are herein incorporated by reference.

BACKGROUND

1. Field

The present disclosure generally relates to a display device. More particularly, the present disclosure relates to a display device of which display quality is improved and which allows a bonding defect between a first display substrate and a second display substrate.

2. Description of the Related Art

With the development of multimedia, the importance of display devices is increasing. Accordingly, various kinds of display devices such as liquid crystal display (LCD) devices and organic light-emitting diode (OLED) display devices are being used.

Among the display devices, a self-light-emitting display device includes self-light-emitting elements such as organic light-emitting diodes. The self-light-emitting element may include two electrodes and a light-emitting layer interposed therebetween. In the case in which the self-light-emitting element is the organic light-emitting diode, electrons and holes provided by two electrodes are recombined to generate excitons in the light-emitting layer, and an excited state of the excitons is changed to a ground state so that light can be emitted.

Since such a self-light-emitting display device does not require a separate light source, power consumption of the self-light-emitting display device can be low, and the self-light-emitting display device can be formed in a light and thin form and has high quality properties such as a wide viewing angle, high brightness and contrast, and a fast response speed, and thus the self-light-emitting display device is attracting attention as a next-generation display device.

SUMMARY

Aspects of the present disclosure provide a display device of which display quality is improved and which allows a bonding defect between a first display substrate and a second display substrate to be suppressed or prevented.

It should be noted that objects of the present disclosure are not limited to the above-described objects, and other objects of the present disclosure will be apparent to those skilled in the art from the following descriptions.

An embodiment of a display device including a plurality of light-output areas through which incident light is emitted and a light-blocking area which blocks the incident light, the display device includes a substrate, a bank layer which is disposed in the light-blocking area on the substrate and defines a plurality of openings, each of which is disposed in one of the plurality of light-output areas, and a color control pattern disposed in the opening of the bank layer, wherein the bank layer includes a first bank area which has a first thickness and defines the plurality of openings and a second bank area which is disposed between the plurality of openings and has a second thickness smaller than the first thickness.

An embodiment of a display device including a plurality of light-emitting areas from which light is emitted and a non-light-emitting area which surrounds the light-emitting areas, the display device includes a substrate, a bank layer which is disposed in the plurality of non-light-emitting areas of the substrate and defines a plurality of openings and sub-openings, and color control patterns disposed in the plurality of openings in the bank layer, wherein each of the plurality of openings are disposed in a corresponding one of the plurality of light-emitting areas, and the sub-opening is disposed in the non-light-emitting area.

An embodiment of a display includes a substrate, a bank layer which is disposed on the substrate and includes a plurality of openings passing therethrough in a thickness direction and a plurality of bank grooves recessed from one surface toward the other surface of the bank layer in the thickness direction, and a color control pattern disposed in the opening in the bank layer, wherein the opening and the bank groove are alternately and repeatedly disposed in a first direction when viewed from above, the plurality of openings are disposed to be spaced apart from each other when viewed from above, and the bank grooves are disposed to be spaced apart from each other when viewed from above.

As a result, in a display device according to one embodiment, display quality is improved, and a bonding defect between a first display substrate and a second display substrate can be suppressed or prevented.

Effects according to the embodiments are not limited to the above description, and various effects have been described in the present specification.

BRIEF DESCRIPTION OF THE DRAWINGS

The above and other aspects and features of the present disclosure will become more apparent by describing example embodiments thereof in detail with reference to the attached drawings, in which.

DETAILED DESCRIPTION OF THE EMBODIMENTS

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, specific embodiments of the present disclosure will be described with reference to the accompanying drawings.

Figure 1:
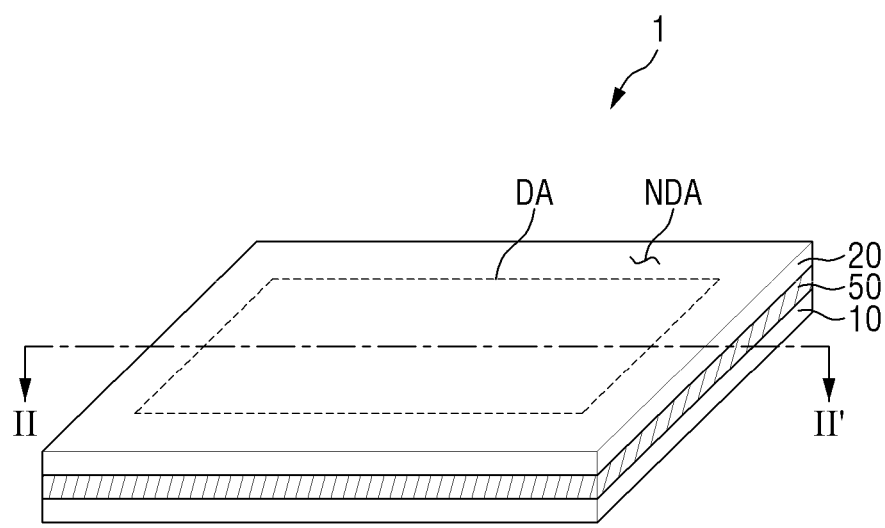
FIG. 1 is a perspective view illustrating a display device according to one embodiment.

FIG. 1 is a perspective view illustrating a display device according to one embodiment.

Referring to FIG. 1, a display device 1 may be referred to as any electronic device provided with a display screen. For example, a television, a notebook, a monitor, a billboard, a mobile phone, a smart phone, a tablet personal computer (PC), an electronic watch, a smart watch, a watch phone, a mobile communication terminal, an electronic notebook, an e-book reader, a portable multimedia player (PMP), a navigation device, a game console, a digital camera, or an Internet of Things device may be included in the display device 1.

The display device 1 illustrated in the drawing is a television. The display device 1 may have high resolution or ultra-high resolution such as high definition (HD), ultra-high definition (UHD), 4K, or 8K but is not limited thereto.

The display device 1 may be formed in a rectangular shape when viewed from above. When viewed from above, the shape of the display device 1 is not limited to that in the drawing, and the display device 1 may have a circular shape or another shape.

The display device 1 may include a display area DA in which an image is displayed and a non-display area NDA in which an image is not displayed. The display area DA may include a plurality of pixels PX. The non-display area NDA may be positioned around the display area DA and may surround the display area DA.

Figure 2:
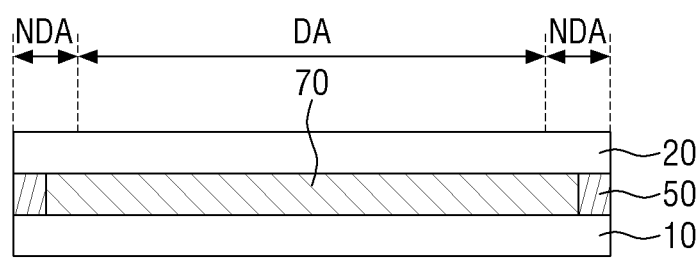
FIG. 2 is a schematic cross-sectional view taken along line II-II' of FIG. 1.

FIG. 2 is a schematic cross-sectional view taken along line II-II' of FIG. 1.

Referring to FIG. 2, the display device 1 may include a first display substrate 10 and a second display substrate 20 facing the first display substrate 10. The display device 1 may further include a sealing member 50 coupling the first display substrate 10 and the second display substrate 20 and a filling layer 70 filling a space disposed between the first display substrate 10 and the second display substrate 20.

The first display substrate 10 may include elements and circuits for displaying an image, for example, pixel circuits such as switching elements, a pixel definition layer PDL defining a light-emitting area EMA and a non-light-emitting area NEM, which will be described below, in the display area DA, and a self-light-emitting element. As an example, the self-light-emitting element may include at least one of an organic light-emitting diode, a quantum dot light-emitting diode, an inorganic micro light-emitting diode (for example, micro LED), and an inorganic nano light-emitting diode (for example, nano LED). Hereinafter, an example of a case in which the self-light-emitting element is the organic light-emitting diode will be described.

The second display substrate 20 may be positioned above the first display substrate 10 and may face the first display substrate 10. The second display substrate 20 may include a color control structure configured to convert a color of incident light. The color control structure may control a wavelength of the incident light and thus convert the color of the incident light.

In the non-display area NDA, the sealing member 50 may be positioned between the first display substrate 10 and the second display substrate 20. The sealing member 50 may be disposed along edges of the first display substrate 10 and the second display substrate 20 in the non-display area NDA and may surround the display area DA when viewed from above. The first display substrate 10 and the second display substrate 20 may be coupled by the sealing member 50. The sealing member 50 may include an organic material. The sealing member 50 may be formed of an epoxy-base resin but is not limited thereto.

The filling layer 70 may be disposed in a space which is surrounded by the sealing member 50 between the first display substrate 10 and the second display substrate 20. The filling layer 70 may fill the space between the first display substrate 10 and the second display substrate 20. The filling layer 70 may be formed of a material through which light may pass. The filling layer 70 may include an organic material. For example, the filling layer 70 may be formed of a Si-base organic material, an epoxy-base organic material, or the like but is not limited thereto. The filling layer 70 may also be omitted.

Figure 3:
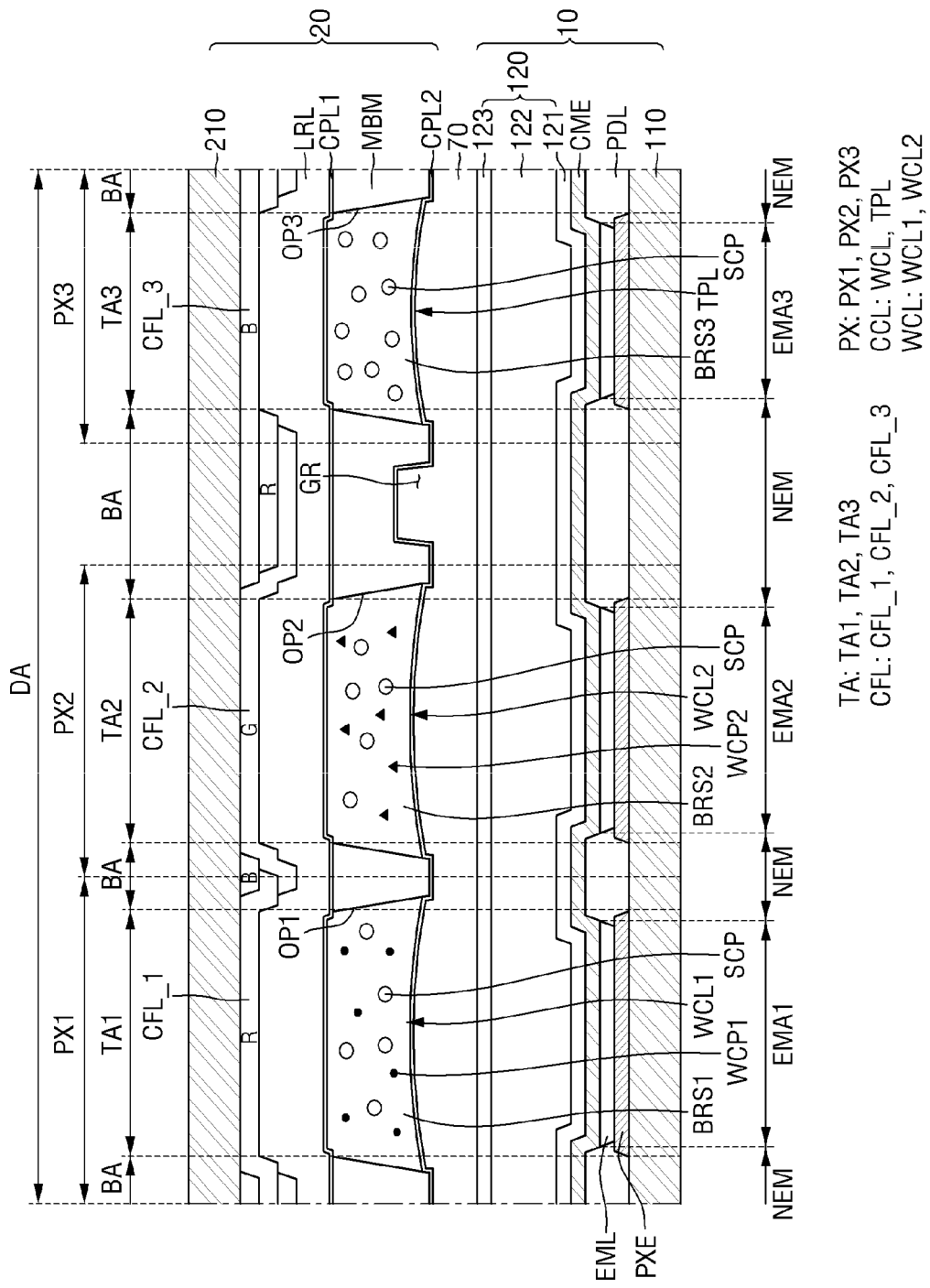
FIG. 3 is a cross-sectional view illustrating the display device according to one embodiment.

FIG. 3 is a cross-sectional view illustrating the display device according to one embodiment.

Referring to FIG. 3, the display device includes the plurality of pixels PX. The plurality of pixels PX may be disposed in the display area DA. In order to display full colors, the pixels PX may include a first pixel PX1, a second pixel PX2, and a third pixel PX3 which display different colors. Each of the first pixel PX1, the second pixel PX2, and the third pixel PX3 may be provided as a plurality of first pixels PX1, a plurality of second pixels PX2, and a plurality of third pixels PX3. For example, the pixels PX may include the first pixel PX1 configured to emit red light, the second pixel PX2 configured to emit green light, and the third pixel PX3 configured to emit blue light.

Each of the pixels PX (PX1, PX2, and PX3) may include a light-output area TA and a light-blocking area BA. The light-blocking area BA of one pixel PX is in contact with the light-blocking area BA of the adjacent pixel PX (regardless of whether the pixel PX is in the same pixel PX). The light-blocking areas BA of the pixels PX which are adjacent to each other may be connected as one area. In addition, although the light-blocking areas BA of the pixels PX may be connected as one area, the light-blocking areas BA are not limited thereto. The light-output areas TA of the pixels PX disposed adjacent to each other may be divided by the light-blocking areas BA. As described below, the light-output areas TA and the light-blocking areas BA of the pixels PX may be divided by a bank layer MBM.

Conceptually, the pixels PX disposed adjacent to each other may be considered as being in contact with each other. Even in this case, a border between the pixels PX may be present in the light-blocking areas BA which are integrally connected so that the border may not be physically recognized. The border disposed between the pixels PX may be present at a middle position of a separation space between the light-output areas TA of the pixels PX adjacent to each other (or middle position of the light-blocking area BA in a width direction).

The first display substrate 10 includes a first substrate 110 and a plurality of light-emitting elements disposed on the first substrate 110.

A cross-sectional structure of the first display substrate 10 will be described sequentially in an upward direction in the drawing. The first substrate 110 may be an insulating substrate. The first substrate 110 may include a transparent material. For example, the first substrate 110 may include a transparent insulating material such as glass and quartz. The first substrate 110 may be a rigid substrate. However, the first substrate 110 is not limited thereto, may include plastic such as polyimide, and may also have a flexible property such as being bent, folded, and rolled.

A plurality of pixel electrodes PXE may be disposed on one surface of the first substrate 110. The pixel electrode PXE may be disposed in each of the pixels PX. The pixel electrodes PXE of the pixels PX adjacent to each other may be divided from each other. A circuit layer (not shown) configured to drive the pixel electrodes PXE may be disposed between the first substrate 110 and the pixel electrodes PXE. The circuit layer (not shown) may include a plurality of thin film transistors, capacitors, and the like.

The pixel electrode PXE may be a first electrode, for example, an anode electrode, of a light-emitting element (or light-emitting diode). The pixel electrode PXE may have a stack layer structure in which a material layer with a high work function, such as a layer of indium-tin-oxide (ITO), indium-zinc-oxide (IZO), zinc oxide (ZnO), or induim oxide ($In_2O_3$), and a reflective material layer, such as a layer of silver (Ag), magnesium (Mg), aluminum (Al), platinum (Pt), lead (Pd), gold (Au), nickel (Ni), neodium (Nd), iridium (Ir), chromium (Cr), lithium (Li), calcium (Ca), or a mixture thereof, are stacked. The material layer with a high work function may be disposed on the reflective material layer to be disposed close to the light-emitting layer EML. The pixel electrode PXE may have a multilayer structure of ITO/Mg, ITO/MgF, ITO/Ag, or ITO/Ag/ITO but is not limited thereto.

The pixel definition layer PDL may be disposed along the border of the pixels PX on one surface of the first substrate 110. A plurality of openings disposed on the pixel electrodes PXE and exposing the pixel electrodes PXE is defined in the pixel definition layer PDL. The non-light-emitting area NEM and the light-emitting area EMA may be divided by the pixel definition layer PDL and the openings. The non-light-emitting area NEM overlaps the light-blocking area BA, a shape of the non-light-emitting area NEM when viewed from above may correspond to a shape of the light-blocking area BA when viewed from above.

The pixel definition layer PDL may include an organic insulating material such as polyacrylate resin, epoxy resin, phenolic resin, polyamide resin, polyimide rein, unsaturated polyester resin, poly phenylenether resin, polyphenylenesulfide resin, or benzocyclobutene (BCB). The pixel definition layer PDL may also include an inorganic material.

The light-emitting layer EML is disposed on the pixel electrode PXE exposed by the pixel definition layer PDL. In one embodiment in which the display device is an organic light-emitting display device, the light-emitting layer EML may include an organic layer including an organic material. The organic layer may include an organic light-emitting layer EML and may further include a hole injection/transferring layer and/or an electron injection/transferring layer as an auxiliary layer configured to aid in light-emitting as necessary. In another embodiment, in a case in which the display device is an LED display device, a nano LED display device, or the like, the light-emitting layer EML may include an inorganic material such as inorganic semiconductor.

In some embodiments, the light-emitting layer EML may have a tandem structure including a plurality of organic light-emitting layers EML which are disposed to be stacked in a thickness direction and a charge generation layer disposed between the organic light-emitting layers EML. Although the stacked organic light-emitting layers EML may emit light rays with the same wavelength, the stacked organic light-emitting layers EML may also emit light rays with different wavelengths. At least some layers of the light-emitting layers EML of the pixels PX may be separated from the light-emitting layers EML of the adjacent pixels PX.

In one embodiment, wavelengths of light rays emitted by the light-emitting layer EML may be the same for each pixel PX. For example, the light-emitting layer EML of the pixels PX may emit blue light or ultraviolet light, and a color control structure may include wavelength conversion layers WCL to display a color for each pixel PX.

In another embodiment, wavelengths of light rays emitted by the light-emitting layer EML may be different according to color pixels PX. For example, the light-emitting layer EML of the first pixel PX1 may emit light of a first color, the light-emitting layer EML of the second pixel PX2 may emit light of a second color, and the light-emitting layer EML of the third pixel PX3 may emit light of a third color.

A common electrode CME may be disposed on the light-emitting layer EML. The common electrode CME may be in contact with an upper surface of the pixel definition layer PDL as well as the light-emitting layer EML.

The common electrode CME may be connected to each of the first pixel PX1, the second pixel PX2, and the third pixel PX3. The common electrode CME may be an entire electrode which is disposed to each of the pixels PX. The common electrode CME may be a second electrode of the light-emitting diode, for example, a cathode electrode.

The common electrode CME may include a material layer with a low work function, such as a layer of Li, Ca, LiF/Ca, LiF/Al, Al, Mg, Ag, Pt, Pd, Ni, Au Nd, Ir, Cr, BaF, Ba, or a compound or mixture thereof (for example, a mixture of Ag and Mg). The common electrode CME may further include a thin transparent metal oxide layer disposed on the material layer with the low work function.

The pixel electrode PXE, the light-emitting layer EML, and the common electrode CME may form the light-emitting element (for example, the organic light-emitting diode). Light emitted by the light-emitting layer EML may be emitted upward through the common electrode CME.

A thin film encapsulation structure 120 (121, 122, and 123) may be disposed on the common electrode CME. The thin film encapsulation structure 120 may include at least one thin film encapsulation layer. For example, the thin film encapsulation layer may include a first inorganic film 121, an organic film 122, and a second inorganic film 123. Each of the first inorganic film 121 and the second inorganic film 123 may include silicon nitride, silicon oxide, silicon oxynitride, or the like. The organic film 122 may include an organic insulating material such as polyacrylate resin, epoxy resin, phenolic resin, polyamide resin, polyimide rein, unsaturated polyester resin, poly phenylenether resin, polyphenylenesulfide resin, or BCB.

The second display substrate 20 may be disposed on the thin film encapsulation structure 120 so that the second display substrate 20 may face the thin film encapsulation structure 120. A cross-sectional structure of the second display substrate 20 will be described sequentially in a thickness direction in the drawing. The second substrate 210 of the second display substrate 20 may include a transparent material. The second substrate 210 may include a transparent insulating material such as glass or quartz. The second substrate 210 may be a rigid substrate. However, the second substrate 210 is not limited thereto and may include plastic such as polyimide and may also have a flexible property such as being bent, folded, and rolled.

A substrate, which is the same as the first substrate 110, may be used as the second substrate 210, but there may be differences in material, thickness, transmittance, or the like between the first substrate 110 and the second substrate 210. For example, the second substrate 210 may have a higher transmittance than the first substrate 110. The second substrate 210 may have a greater or smaller thickness than the first substrate 110.

Color filter layers CFL may be disposed on one surface of the second substrate 210. Each of the color filter layers CFL may include a colorant such as dye or pigment which absorbs a wavelength except a corresponding color wavelength. The color filter layer CFL may serve to block light of a color, which is not a color corresponding to the pixel PX, from being emitted. That is, the color filter layer CFL may allow light of a specific color to pass therethrough selectively.

The color filter layers CFL may include a first color filter layer CFL_1, a second color filter layer CFL_2, and a third color filter layer CFL_3. The first color filter layer CFL_1 may be a red filter layer, the second color filter layer CFL_2 may be a green filter layer, and the third color filter layer CFL_3 may be a blue filter layer. That is, the first color filter layer CFL_1 may allow red light to pass therethrough selectively, the second color filter layer CFL_2 may allow green light to pass therethrough selectively, and the third color filter layer CFL_3 may allow blue light to pass therethrough selectively.

The first color filter layer CFL_1 may be disposed in the first pixel PX1, the second color filter layer CFL_2 may be disposed in the second pixel PX2, and the third color filter layer CFL_3 may be disposed in the third pixel PX3.

In addition, the first color filter layer CFL_1, the second color filter layer CFL_2, and the third color filter layer CFL_3 may also be disposed in the light-blocking area BA. That is, the first color filter layer CFL_1, the second color filter layer CFL_2, and the third color filter layer CFL_3 may be disposed in the light-output area TA of the pixels PX and may also be disposed in an entire area of the light-blocking area BA of one pixel PX. In other words, any one of the first color filter layer CFL_1, the second color filter layer CFL_2, and the third color filter layer CFL_3 may be disposed in one of the light-output areas TA (TA1, TA2, and TA3) of the pixel PX, and all of the first color filter layer CFL_1, the second color filter layer CFL_2, and the third color filter layer CFL_3 may be disposed in the light-blocking area BA of one pixel PX.

For example, the first color filter layer CFL_1 may be disposed in a first light-output area TA1, the second color filter layer CFL_2 may be disposed in a second light-output area TA2, and the third color filter layer CFL_3 may be disposed in a third light-output area TA3.

The first color filter layer CFL_1, the second color filter layer CFL_2, and the third color filter layer CFL_3 may be disposed in the light-blocking area BA. In addition, the third color filter layer CFL_3 may be disposed on the second substrate 210, the first color filter layer CFL_1 may be disposed on the third color filter layer CFL_3, and the second color filter layer CFL_2 may be disposed on the first color filter layer CFL_1. That is, as depicted in FIG. 3, in the light-blocking area BA, the color filter layers CFL may be disposed in order of the third color filter layer CFL_3, the first color filter layer CFL_1, and the second color filter layer CFL_2 in the thickness direction in the drawing. The first color filter layer CFL_1, the second color filter layer CFL_2, and the third color filter layer CFL_3 may overlap each other in the light-blocking area BA.

Since the first color filter layer CFL_1, the second color filter layer CFL_2, and the third color filter layer CFL_3 are disposed in the light-blocking area BA, light may be prevented from being emitted from the area of the display device, and external light may also be suppressed from being reflected. Since each of the color filter layers CFL_1, CFL_2, and CFL_3 may block light of a color, which is not a color corresponding to the pixel PX, from being emitted, all of the red light, green light, and blue light may be blocked in the light-blocking area BA.

In another embodiment, an upper light-absorption member (not shown) may be disposed on the second substrate 210. The upper light-absorption member (not shown) may overlap the pixel definition layer PDL of the first display substrate 10 to be positioned in the non-light-emitting area NEM. The upper light-absorption member (not shown) may include a light-absorption material which absorbs light of a visual light wavelength band. For example, the upper light-absorption member (not shown) may be formed of a material used for a black matrix of the display device. The upper light-absorption member (not shown) may be a kind of light-blocking member.

A low refractive layer LRL may be disposed on the color filter layer CFL. The low refractive layer LRL may be disposed on both of the light-output area TA and the light-blocking area BA. That is, the low refractive layer LRL overlaps the entirety of the light-output area TA and the light-blocking area BA. The low refractive layer LRL may have a lower refractive index than a color control pattern CCL. For example, the low refractive layer LRL may have a refractive index ranging from about 1.1 to about 1.4.

The low refractive layer LRL may reflect some light, which is emitted from the color control pattern CCL in a direction toward the second substrate 210, back toward the color control pattern CCL. That is, since the low refractive layer LRL recycles at least the some light of the light which passes through the color control pattern CCL and is emitted in the direction toward the second substrate 210, light utilization efficiency may be improved so that light efficiency of the display device 1 may be improved as a result.

The low refractive layer LRL may include an organic material and particles dispersed therein. The particle included in the low refractive layer LRL may be at least any one particle of a zinc oxide (ZnO) particle, a titanium dioxide ($TiO_2$) particle, a hollow silica particle of which an inside is hollow, a silica particle of which an inside is not hollow, a nano silicate particle, and a porogen particle.

In a case in which the low refractive layer LRL is formed as an organic film, a lower surface thereof may be substantially flat in spite of steps of an upper portion thereof. The low refractive layer LRL may fully cover lower surfaces of the color filter layers CFL. In spite of the steps of the color filter layers CFL disposed in the light-output area TA and the steps of the color filter layers CFL disposed in the light-blocking area BA, the lower surface of the low refractive layer LRL may be substantially flat.

A first capping layer CPL1 may be disposed on the low refractive layer LRL. The first capping layer CPL1 may prevent foreign matter such as external moisture or air from permeating to destroy or contaminate the color filter layer CFL and the low refractive layer LRL. In addition, the first capping layer CPL1 may prevent the colorant of the color filter layer CFL from being diffused to other components.

The first capping layer CPL1 may be in direct contact with one surface (lower surface in FIG. 2) of the low refractive layer LRL. The first capping layer CPL1 may be formed of an inorganic material. For example, the first capping layer CPL1 may be formed to include silicon nitride, aluminum nitride, zirconium nitride, titanium nitride, hafnium nitride, tantalum nitride, silicon oxide, aluminum oxide, titanium oxide, tin oxide, silicon oxynitride, or the like.

A bank layer MBM is disposed on the first capping layer CPL1. The bank layer MBM may include an organic material. The bank layer MBM may include a light-absorption material which absorbs light of a visible light wavelength band. In one embodiment, the bank layer MBM may include an organic light-blocking material. The bank layer MBM may include a kind of a light-blocking member. The bank layer MBM may be disposed along the border of the pixel PX in one pixel PX, and the pixel PX may be divided by the bank layer MBM. That is, the bank layer MBM disposed between the first pixel PX1 and the second pixel PX2, the second pixel PX2 and the third pixel PX3, and the first pixel PX1 and the third pixel PX3.

The bank layer MBM may define the light-blocking area BA and the light-output area TA. An area in which the bank layer MBM is disposed is the light-blocking area BA. The color control pattern CCL which is not covered by the bank layer MBM, that is, is exposed due to the bank layer MBM, may be the light-output area TA. Since the bank layer MBM is formed of a material capable of preventing light from passing therethrough, the bank layer MBM serves to prevent generation of a mixed color due to light permeating the adjacent pixel PX. In addition, in a process of forming the color control pattern CCL, the bank layer MBM may serve as a partition wall which guides an ink composition to be stably sprayed to a desired position in a case in which the color control pattern CCL is formed through an inkjet process or the like.

The bank layer MBM may define openings OP1, OP2, and OP3 which partially expose the first capping layer CPL1. The openings OP1, OP2, and OP3 may be disposed in the light-output area TA and overlap the light-output area TA in the thickness direction. The openings OP1, OP2, and OP3 may overlap the color filter layers CFL in the thickness direction. Each of the color filter layers CFL overlapping the openings OP1, OP2, or OP3 may be any one of the first color filter layer CFL_1, the second color filter layer CFL_2, and the third color filter layer CFL_3. That is, the plurality of openings OP1, OP2, and OP3 defined by the bank layer MBM may be provided, and each of the plurality of openings OP1, OP2, and OP3 may overlap any one of the first color filter layer CFL_1, the second color filter layer CFL_2, and the third color filter layer CFL_3.

An area in which the bank layer MBM is disposed may be substantially the same as the light-blocking area BA, and an area in which the openings OP1, OP2, and OP3 of the bank layer MBM are disposed may be substantially the same as the light-output area TA, but the areas are not limited thereto.

One surface of the bank layer MBM may protrude from one surface of the color control patterns CCL in the thickness direction but is not limited thereto. A protrusion height (or thickness) of the bank layer MBM protruding from wavelength conversion patterns WCL1 and WCL2 of a light-transmitting layer TPL may be in the range of about 1 μm to about 3 μm, about 1.4 μm to about 1.8 μm, or about 1.6 μm, but is not limited thereto.

The color control patterns CCL (wavelength control patterns) are disposed in the openings OP1, OP2, and OP3 defined by the bank layer MBM. The color control patterns CCL may include wavelength conversion layers WCL, each of which converts a wavelength of incident light, and/or light-transmitting layers TPL, each of which allows incident light to pass therethrough in a state in which a wavelength of the incident light is maintained. The wavelength conversion layers WCL or the light-transmitting layers TPL may be disposed to be divided by the pixels PX. The wavelength conversion layers WCL adjacent to each other or the light-transmitting layers TPL adjacent to each other may overlap the light-emitting areas EMA and light-output areas TA in the thickness direction. The wavelength conversion layer WCL adjacent to each other or the light-transmitting layers TPL adjacent to each other may be spaced apart from each other. Separation spaces may substantially overlap the light-blocking areas BA.

The wavelength conversion layer WCL may be disposed in the pixel PX in which a wavelength of incident light from the light-emitting layer EML is different from a wavelength of a color of the corresponding pixel PX so that the wavelength needs to be changed. The light-transmitting layer TPL may be disposed in the pixel PX in which a wavelength of incident light from the light-emitting layer EML is the same as a wavelength of a color of the corresponding pixel PX. The illustrated embodiment corresponds to a case in which the light-emitting layer EML of the pixel PX emits the third color, the wavelength conversion layer WCL is disposed in each of the first pixel PX1 and the second pixel PX2, and the light-transmitting layer TPL is disposed in the third pixel PX3. In another embodiment, when the light-emitting layer EML of the pixel PX emits light, such as ultraviolet light, with a wavelength which is different from a wavelength of a color of the pixel PX, only the wavelength conversion layers WCL may be disposed in the pixel PX without the light-transmitting layer TPL. In still another embodiment, when each of the light-emitting layers EML of the pixels PX emits light corresponding to a color of the pixel PX, the light-transmitting layers TPL may be disposed on the pixels PX without the wavelength conversion layer WCL, or the light-transmitting layer TPL may also not be disposed in all of the pixels PX.

In the illustrated embodiment, the wavelength conversion layers WCL may include a first wavelength conversion pattern WCL1 disposed on the first pixel PX1 and a second wavelength conversion pattern WCL2 disposed on the second pixel PX2.

The first wavelength conversion pattern WCL1 may include a first base resin BRS1 and a first wavelength conversion material WCP1 disposed in the first base resin BRS1. The second wavelength conversion pattern WCL2 may include a second base resin BRS2 and a second wavelength conversion material WCP2 disposed in the second base resin BRS2. The light-transmitting layer TPL may include a third base resin BRS3 and a scatterer SCP disposed therein.

Each of the first, second, and third base resins BRS1, BRS2, and BRS3 may include a light-transmitting organic material. For example, each of the first to third base resins BRS1, BRS2, and BRS3 may be formed to include an epoxy-base resin, polyacrylate resin, cardo resin, imide resin, or the like. All of the first, second, and third base resins BRS1, BRS2, and BRS3 may be formed of the same material but are not limited thereto.

The scatterer SCP may be metal oxide particles or organic particles. An example of metal oxide may be titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, and an example of a material of the organic particles may be polyacrylate resin or urethane resin.

The first wavelength conversion material WCP1 may be a material which converts blue light to red light, and the second wavelength conversion material WCP2 may be a material which converts blue light to green light. Each of the first wavelength conversion material WCP1 and the second wavelength conversion material WCP2 may be quantum dots, quantum rods, phosphors, or the like. The quantum dots may include group IV nanocrystals, II-VI compound nanocrystals, III-V group compound nanocrystals, IV-VI group nanocrystals, or a combination thereof. Each of the first wavelength conversion pattern WCL1 and the second wavelength conversion pattern WCL2 may further include a scatterer SCP which improves wavelength conversion efficiency.

The light-transmitting layer TPL disposed in the third pixel PX3 allows blue light incident from the light-emitting layer EML to pass therethrough in a state in which a wavelength thereof is maintained. The scatterer SCP in the light-transmitting layer TPL may serve to scatter light to adjust an emission angel of light emitted through the light-transmitting layer TPL. The light-transmitting layer TPL may not include a wavelength conversion material.

The display device 1 may further include bank grooves GR. The bank grooves GR may be defined by the bank layer MBM. The bank groove GR may have a shape recessed from one surface (lower surface in FIG. 3 and upper surface in FIG. 6) of the bank layer MBM in the thickness direction. The bank groove GR may be disposed in the light-blocking area BA. The bank groove GR may overlap the first color filter layer CFL_1, the second color filter layer CFL_2, and the third color filter layer CFL_3.

The bank groove GR may have the shape recessed from the one surface (upper surface in FIG. 6 and lower surface in FIG. 3) of the bank layer MBM in the direction toward the second substrate 210. The bank groove GR may have a cross-sectional shape curved from a lower side to an upper side thereof. In other words, the bank groove GR may be defined by the bank layer MBM and have a shape curved from one surface (lower surface in the cross-sectional view) of the bank layer MBM in the direction toward the second substrate 210 (or the other surface (upper surface in the cross-sectional view) thereof) in the thickness direction. The bank groove GR may be filled with the filling layer 70 but is not limited thereto and may be, for example, filled with an additional filling member, spacer, or the like.

Since the bank layer MBM includes the bank groove GR, in a case in which the color control pattern CCL is printed through an ink-jet printing method, missetting ink may flow into the bank groove GR. Accordingly, a bonding defect between the first display substrate 10 and the second display substrate 20 which may occur due to the missetting ink may be suppressed or prevented. In addition, since the bank layer MBM remains in an area in which the bank groove GR is disposed, a partition wall surrounding the color control pattern CCL may be more rigid, and thus the color control pattern CCL may be suppressed or prevented from flowing to the outside. The bank groove GR will be described in detail bellow.

A second capping layer CPL2 is disposed on the wavelength conversion layer WCL and the light-transmitting layer TPL. The second capping layer CPL2 may be formed of an inorganic material. The second capping layer CPL2 may be formed of a material selected from the listed materials of the first capping layer CPL1. The second capping layer CPL2 and the first capping layer CPL1 may be formed of the same material but are not limited thereto.

The second capping layer CPL2 may cover the wavelength conversion patterns WCL1 and the WCL2, the light-transmitting layer TPL, and the bank layer MBM. The second capping layer CPL2 may cover one surface of each of the wavelength conversion patterns WCL1 and WCL2 and the light-transmitting layer TPL. The second capping layer CPL2 may cover a side surface of the bank layer MBM as well as one surface thereof. The second capping layer CPL2 may have a conformal shape with respect to surface steps formed due to the color control pattern CCL and the bank layer MBM.

The filling layer 70 may be disposed between the first display substrate and the second display substrate 20. The filling layer 70 may fill a space between the first display substrate 10 and the second display substrate 20 and serve to couple the first display substrate 10 and the second display substrate 20. The filling layer 70 may be disposed between the thin film encapsulation structure 120 of the first display substrate 10 and the second capping layer CPL2 of the second display substrate 20. The filling layer 70 may be formed of a silicon (Si)-base organic material, an epoxy-base organic material, or the like but is not limited thereto.

Hereinafter, the bank groove GR will be described in more detail with reference to FIGS. 4, 5, 6, and 7 again.

Figure 4:
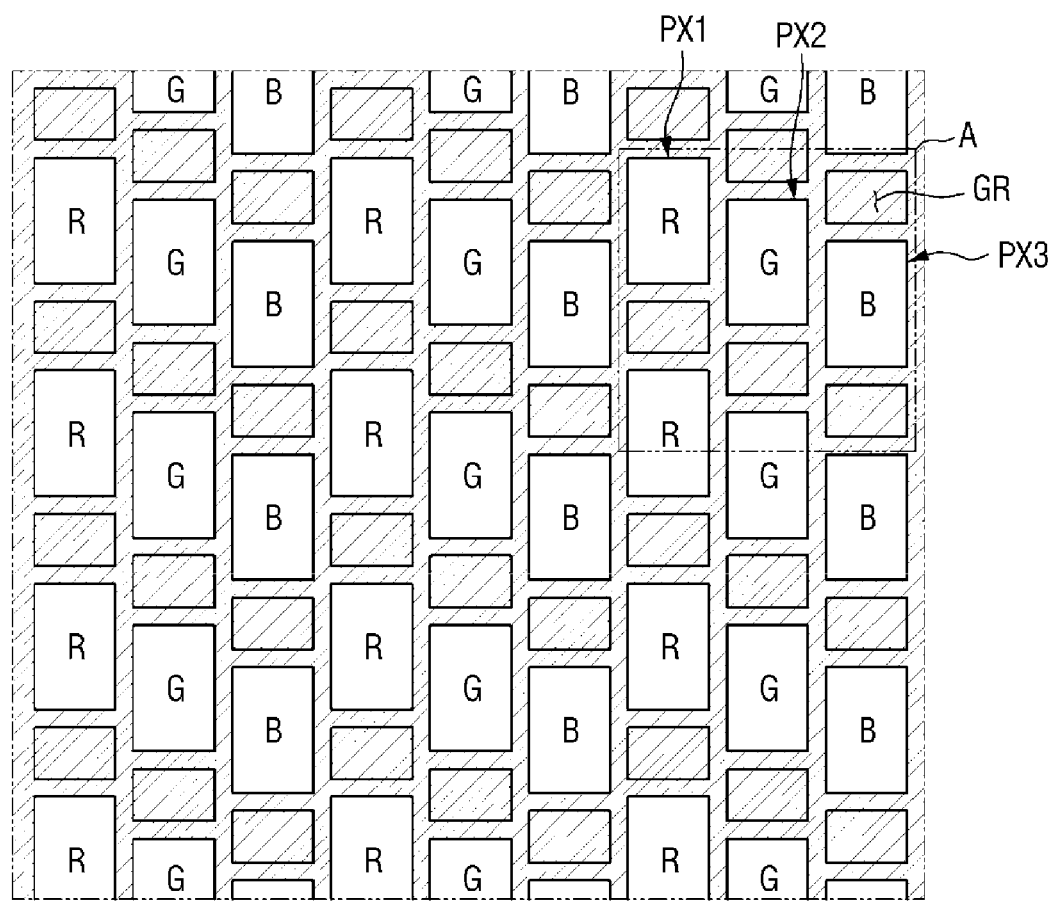
FIG. 4 is a schematic layout showing pixel arrangement and bank groove arrangement of the display device according to one embodiment.
Figure 4:
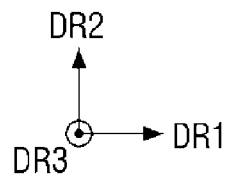
Figure 5:
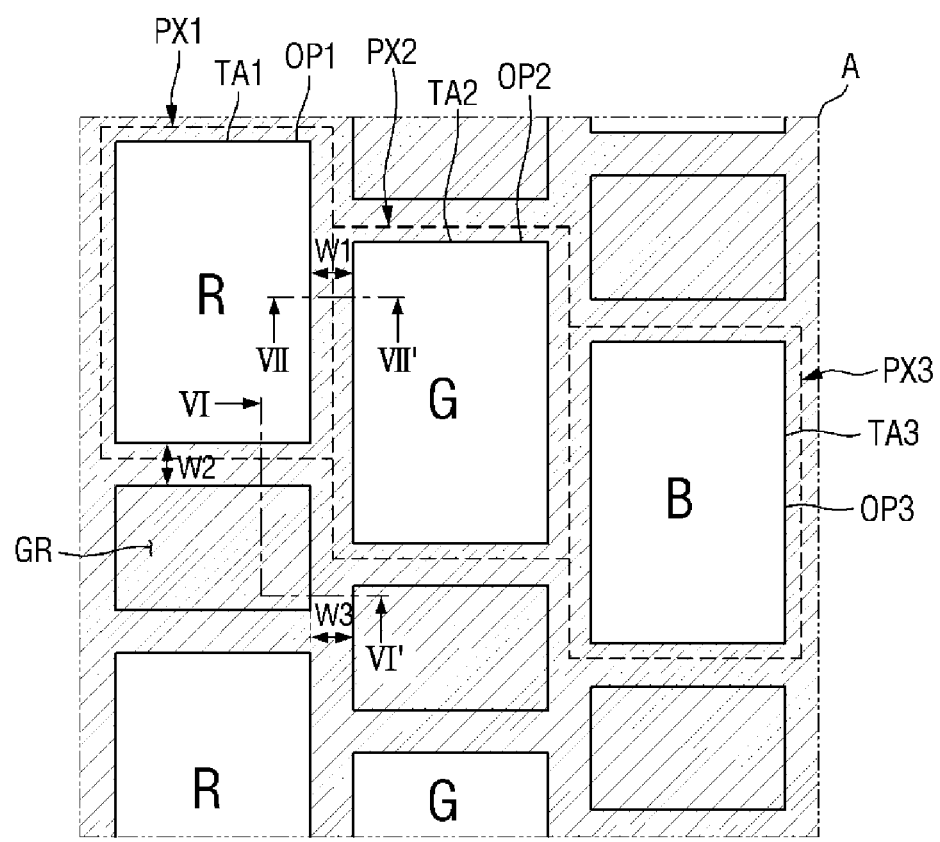
FIG. 5 is an enlarged view illustrating region A of FIG. 4.
Figure 6:
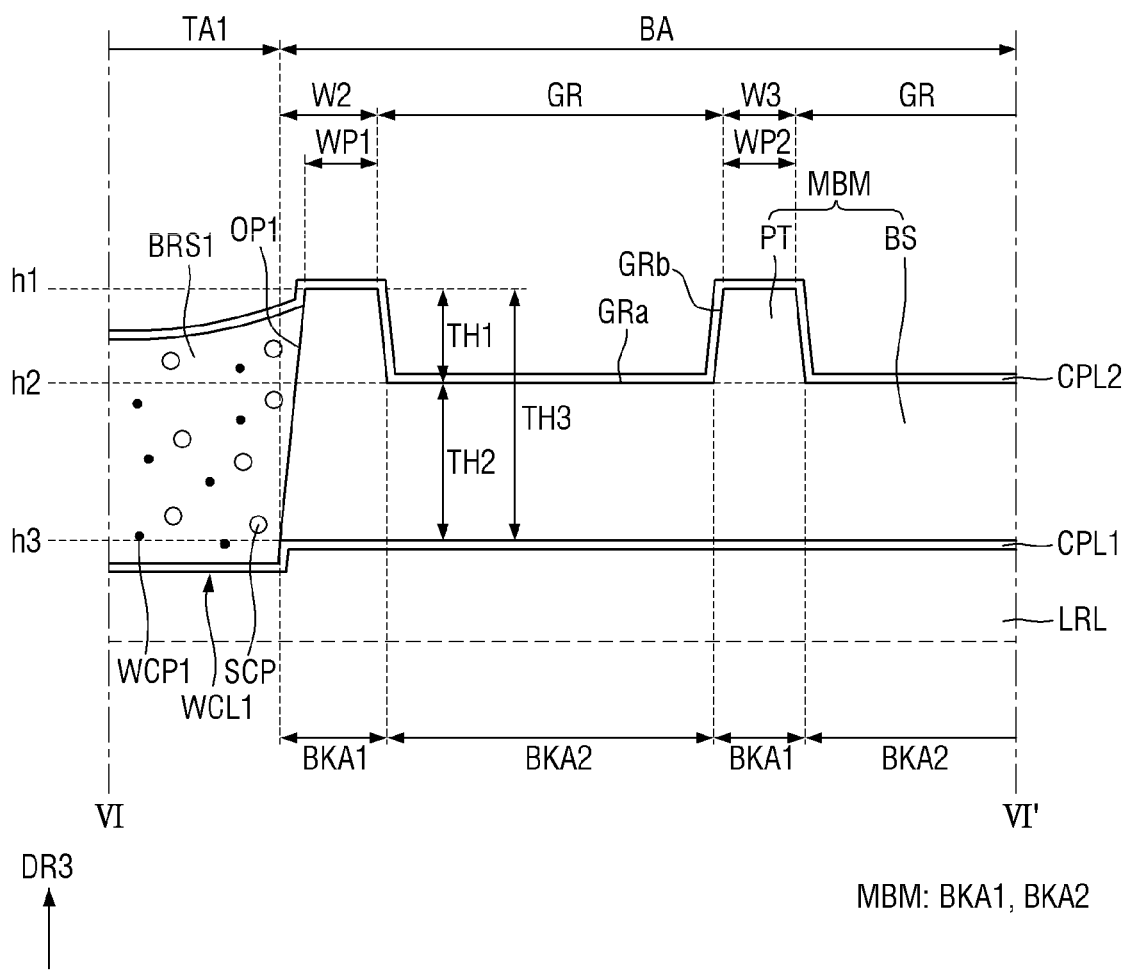
FIG. 6 is a cross-sectional view taken along line VI-VI' of FIG. 5.
Figure 7:
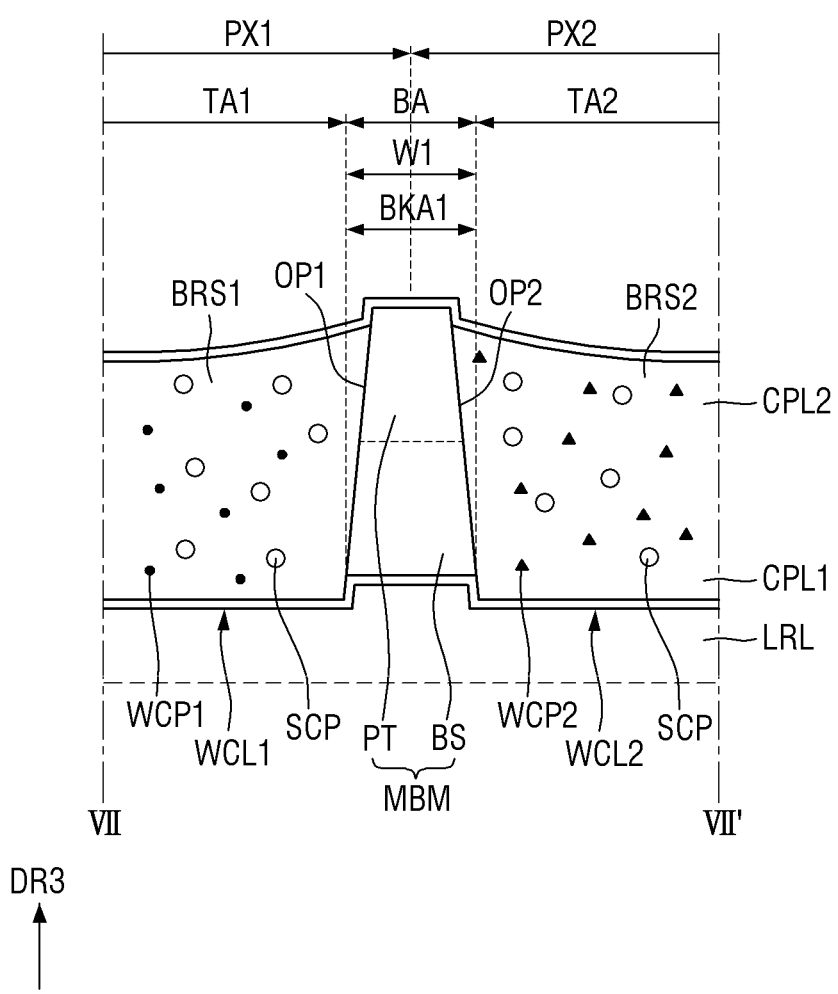
FIG. 7 is a cross-sectional view taken along line VII-VII' of FIG. 5.

FIG. 4 is a schematic layout showing pixel arrangement and bank groove arrangement of the display device according to one embodiment. FIG. 5 is an enlarged view illustrating region A of FIG. 4. FIG. 6 is a cross-sectional view taken along line VI-VI' of FIG. 5. FIG. 7 is a cross-sectional view taken along line VII-VII' of FIG. 5. FIGS. 6 and 7 show the second display substrate 20 of which a shape is vertically inverted from a shape of the second display substrate 20 of FIG. 3 for the sake of convenience in the description.

Further referring to FIGS. 4, 5, 6, and 7, FIG. 4 is the schematic layout showing the pixel arrangement and the bank groove arrangement of the display device according to one embodiment. Hereinafter, in FIG. 4, a first direction DR1 may be referred to as a lateral direction, a second direction DR2 may be referred to as a vertical direction which intersects the first direction DR1, and a third direction DR3 intersects the first direction DR1 and the second direction DR2 and may be referred to as the thickness direction of the display device 1 (see FIG. 1).

An overall shape of the pixel PX may be similar to a shape of the light-output area TA of the corresponding pixel PX but is not limited thereto. When viewed from above, each of the pixel PX and the light-output area TA may have a rectangular shape. However, each of the pixel PX and the light-output area TA is not limited thereto and may have, for example, a polygonal shape such as a triangular shape, a pentagonal shape, or a hexagonal shape, a circular shape, or an elliptical shape.

The shape and size of at least any one of the light-output areas TA (TA1, TA2, and TA3) of the pixels PX in the pixels PX may not be the same as those of the remaining pixels. For example, the shape of the light-output area TA (hereinafter, the first light-output area TA1) of the first pixel PX1, the shape of the light-output area TA (hereinafter, the second light-output area TA2) of the second pixel PX2, and the shape of the light-output area TA (hereinafter, the third light-output area TA3) of the third pixel PX3 may be substantially the same, and the sizes thereof may be different, but the present disclosure is not limited thereto.

Each of the first pixel PX1, the second pixel PX2, and the third pixel PX3 may be provided as a plurality of first pixels PX1, a plurality of second pixels PX2, and a plurality of third pixels PX3 which are arrayed in the second direction DR2. In other words, the plurality of first pixels PX1 may be provided so that the first pixels PX1 may be arrayed in the second direction DR2. The second pixel PX2 may be disposed at one side of the first pixel PX1 in the first direction DR1. The plurality of second pixels PX2 may be provided so that the second pixels PX2 may be arrayed in the second direction DR2. The third pixel PX3 may be disposed at one side of the second pixel PX2 in the first direction DR1. The plurality of third pixels PX3 may be provided so that the third pixels PX3 may be arrayed in the second direction DR2.

That is, the same pixel (for example, any one of the first pixel PX1, the second pixel PX2, and the third pixel PX3) is repeatedly disposed in the second direction DR2, and the first pixel PX1, the second pixel PX2, and the third pixel PX3 may be alternately and repeatedly disposed in the first direction DR1.

The first pixel PX1, the second pixel PX2, and the third pixel PX3 disposed in the first direction DR1 may be disposed to be misaligned with each other in the first direction DR1. In other words, the first pixel PX1 and the second pixel PX2 adjacent to the first pixel PX1 may be disposed to be misaligned with each other in the second direction DR2, the second pixel PX2 and the third pixel PX3 adjacent to the second pixel PX2 may be disposed to be misaligned with each other in the second direction DR2, and the third pixel PX3 and the first pixel PX1 adjacent to the third pixel PX3 may be disposed to be misaligned with each other in the second direction DR2. However, the arrangement of the first pixel PX1, second pixel PX2, and the third pixel PX3 is not limited thereto.

The plurality of bank grooves GR may be provided to be disposed between the pixels PX. In other words, the first pixel PX1 and the bank groove GR may be alternately and repeatedly disposed, the second pixel PX2 and the bank groove GR may be alternately and repeatedly disposed, and the third pixel PX3 and the bank groove GR may be alternately and repeatedly disposed in the second direction DR2. That is, the first opening OP1 and the bank groove GR may be alternately and repeatedly disposed, the second opening OP2 and the bank groove GR may be alternately and repeatedly disposed, and the third opening OP3 and the bank groove GR may be alternately and repeatedly disposed in the second direction DR2.

The bank layer MBM may be disposed between the first opening OP1 and the bank groove GR, between the second opening OP2 and the bank groove GR, and between the third opening OP3 and the bank groove GR which are repeatedly disposed in the second direction DR2. Specifically, when viewed from above, protrusions PT and a portion of a base BS may be positioned in the above areas therebetween.

The bank groove GR may include a bottom surface GRa and a side surface GRb bent from the bottom surface GRa to extend in the thickness direction (third direction DR3). The bank groove GR may have a curved shape, and the bottom surface GRa and the side surface GRb of the bank groove GR may have a curved shape in the bank layer MBM.

At least a portion of each of the bottom surface GRa and the side surface GRb of the bank groove GR may not have a liquid repellent property. In other words, the at least a portion of each of the bottom surface GRa and the side surface GRb of the bank groove GR may have a lyophilic property. Accordingly, the ink which is misset or flows from the opening OP into the bank groove GR may widely spread in the bank groove GR, and a thickness thereof may be minimized. Accordingly, since the bank groove GR is disposed, the ink (or color control pattern CCL) disposed in the bank groove GR may not form a step, and, and in addition, a bonding defect between the first display substrate 10 and the second display substrate 20 may be suppressed or prevented.

The plurality of bank grooves GR may be separated and spaced apart from each other. The plurality of bank grooves GR may be separated from each other by the bank layer MBM. In other words, the bank layer MBM may include the base BS and the protrusion PT protruding from the base BS in the thickness direction (third direction DR3). The base BS and the protrusion PT may be integrally formed but are not limited thereto.

The base BS may be disposed on the entire light-blocking area BA, and the protrusion PT may protrude from a portion of the base BS. A width of the protrusion PT may decrease in a direction away from the base BS but is not limited thereto and may also increase in the thickness direction. For example, as shown in FIG. 6, the protrusion PT has a tapered shaped as it extends upward in the thickness direction. The protrusion PT may protrude from the base BS in the thickness direction toward the first display substrate 10 but is not limited thereto. The bank grooves GR adjacent to each other may be divided by the protrusion PT.

The bank grooves GR may be disposed between the same pixels PX among the plurality of first pixels PX1, the plurality of second pixels PX2, and the plurality of third pixels PX3. In other words, the bank groove GR may be disposed in at least any one space between the first pixels PX1 adjacent to each other among the plurality of first pixels PX1, between the second pixels PX2 adjacent to each other among the plurality of second pixels PX2, and between the third pixels PX3 adjacent to each other among the plurality of third pixels PX3. For example, the bank groove GR may be disposed in each space between the first pixels PX1 repeatedly disposed in the second direction DR2, in each space between the second pixels PX2 repeatedly disposed in the second direction DR2, and in each space between the third pixels PX3 repeatedly disposed in the second direction DR2.

However, the bank groove GR may not be disposed between the different pixels PX1, PX2, and PX3 adjacent to each other. For example, the bank groove GR may not be disposed between the first pixel PX1 and the adjacent second pixel PX2, between the second pixel PX2 and the adjacent third pixel PX3, and between the third pixel PX3 and the adjacent first pixel PX1 but is not limited thereto.

In the case in which the bank groove GR is not disposed between the different pixels PX1, PX2, and PX3 adjacent to each other, the pixels PX1, PX2, and PX3 may be disposed to be closer to each other. For example, the first pixel PX1, the second pixel PX2, and the third pixel PX3 arrayed in the first direction DR1 may be positioned to be closer to each other. Accordingly, a larger number of the pixels PX may be disposed in the same area, and a high resolution may be implemented.

Since the bank grooves GR are disposed between the pixels PX1, PX2, and PX3 arrayed in the second direction DR2, in a case in which a print head which prints the ink in the openings OP of the pixels PX moves in the second direction DR2, missetting ink may be more easily disposed in the bank grooves GR. Accordingly, a bonding defect between the first display substrate 10 and the second display substrate 20 and the like may be suppressed or prevented. Accordingly, reliability of the display device 1 (see FIG. 1) may be improved.

Since the plurality of bank grooves GR are disposed to be separated from each other, even when a portion of the protrusion PT is lost and the color control pattern CCL in the opening OP flows over the bank groove GR, the color control pattern CCL may be suppressed or prevented from flowing over the adjacent another bank groove GR. Accordingly, an amount of color control pattern CCL flowing over the bank groove GR may be minimized, and a decrease in thickness of the color control pattern CCL may be minimized. Accordingly, even when a portion of the protrusion PT of the bank layer MBM surrounding the color control pattern CCL is lost, a predetermined thickness of the color control pattern CCL may be easily maintained, and thus a function of converting or maintaining a wavelength of light passing through the color control pattern CCL may be maintained. In addition, color impression of the display device 1 (see FIG. 1) may be suppressed or prevented from being lowered.

Although not illustrated in the drawings, even when the protrusion PT is not lost, the color control pattern CCL (or ink) may be disposed in the bank groove GR due to misset. In this case, a volume, a thickness, and the like of the color control pattern CCL (or ink) positioned in the bank groove GR may be smaller than a volume, a thickness, and the like of the color control pattern CCL disposed in the opening OP.

A side surface of the protrusion PT may include the side surface GRb of the bank groove GR, and one surface (upper surface in FIG. 6 and lower surface in FIG. 3) of the base BS may include the bottom surface GRa of the bank groove GR. A sidewall of the opening OP may include a side surface of the base BS and the side surface of the protrusion PT. The sidewall of the opening OP may be formed as the side surface of the base BS and the side surface of the protrusion PT. In this case, the bank groove GR and the opening OP may be defined by the base BS and the protrusion PT. In other words, the bank groove GR may be defined by one surface of the base BS (upper surface in FIG. 6 and lower surface in FIG. 3) and the side surfaces of the protrusion PT, and the opening OP may be defined by the side surface of the base BS and the protrusion PT.

At least a portion of the second capping layer CPL2 may be disposed in the bank groove GR. The second capping layer CPL2 disposed in the bank groove GR may cover the bottom surface GRa and the side surface GRb of the bank groove GR and be in direct contact with the bottom surface GRa and the side surface GRb of the bank groove GR.

A first thickness TH1 of the protrusion PT may be in the range of about $1/100$ to about $1/2$ or about $1/1000$ to about $2/3$ of a third thickness TH3 of the bank layer MBM but is not limited thereto. The first thickness TH1 of the protrusion PT may be smaller than a second thickness TH2 of the base BS and greater than two times of the second thickness TH2 of the base BS. In another example, the first thickness TH1 of the protrusion PT may be substantially the same as the second thickness TH2 of the base BS. In another example, the first thickness TH1 of the protrusion PT may be greater than the second thickness TH2 of the base BS and smaller than $1/500$ of the second thickness TH2 of the base BS, but is not limited thereto. The third thickness TH3 of the bank layer MBM may be substantially the same as the sum of the first thickness TH1 of the protrusion PT and the second thickness TH2 of the base BS. In this case, the thicknesses TH1, TH2, and TH3 may denote an average thickness of each of the thicknesses TH1, TH2, and TH3.

For example, the third thickness TH3 of the bank layer MBM may be in the range of about 8 μm to about 12 μm or about 6 μm to about 14 μm. The first thickness TH1 of the protrusion PT may be in the range of about 4 μm to about 6 μm, about 3 μm to about 7 μm, or about 2 μm to about 8 μm. The second thickness TH2 of the base BS may be in the range of about 4 μm to about 6 μm or about 3 μm to about 7 μm.

Based on one surface or the other surface of the second substrate 210, a second height h2 of one surface (upper surface in FIG. 6 and lower surface in FIG. 3) of the base BS may be positioned higher than a third height h3 of the other surface (lower surface in FIG. 6 and upper surface in FIG. 3) of the bank layer MBM, and a first height h1 of one surface (upper surface in FIG. 6 and lower surface in FIG. 3) of the protrusion PT may be positioned higher than the height h2 of the one surface of the base BS. Based on one surface or the other surface of the second substrate 210, the second height h2 may be between the first height h1 and the third height h3, and a difference between the first height h1 and the second height h2 may be less than or equal to a difference between the second height h2 and the third height h3. Alternatively, the difference between the first height h1 and the second height h2 may be in the range of less than two times of the difference between the second height h2 and the third height h3, be substantially the same as the difference between the second height h2 and the third height h3, or be in the range of less than the difference between the second height h2 and the third height h3 and in the range of less than $1/500$ of the difference between the second height h2 and the third height h3 but is not limited thereto.

The bank layer MBM may further include a first bank area BKA1 and the second bank area BKA2 which have different thickness. The thickness of the first bank area BKA1 may be greater than the thickness of the second bank area BKA2.

The first bank area BKA1 may be disposed to be closer to the openings OP1, OP2, and OP3 than the second bank area BKA2. The first bank area BKA1 may be disposed between each of the openings OP1, OP2, and OP3 and the second bank area BKA2.

When viewed from above, the first bank area BKA1 surrounds each of the openings OP1, OP2, and OP3 and the second bank area BKA2. Each of the openings OP1, OP2, and OP3 may be defined by the first bank area BKA1. The second bank area BKA2 may be disposed between the pixels PX1, PX2, and PX3 adjacent to each other.

The base BS of the bank layer MBM may be disposed in the second bank area BKA2, and the base BS and the protrusion PT of the bank layer MBM may be disposed in the first bank area BKA1. A thickness of the first bank area BKA1 is substantially the same as the third thickness TH3, and a thickness of the second bank area BKA2 is substantially the same as the second thickness TH2.

Since the bank layer MBM remains at a position at which the bank groove GR is disposed, the protrusion PT may be suppressed or prevented from being lost. In other words, the base BS may be positioned at an area in which the bank groove GR is formed, the protrusion PT protruding from the base BS may include the side surface GRb of the bank groove GR. Accordingly, even when an external force is applied to the protrusion PT, the protrusion PT may be suppressed or prevented from being lost. In addition, the color control pattern CCL positioned in the opening OP may be suppressed or prevented from flowing to the outside, and even when the color control pattern CCL flows over the adjacent bank groove GR, an amount thereof may be minimized.

In addition, since the bank layer MBM remains at a position at which the bank groove GR is disposed, an amount of additional component for filling the bank groove GR may be decreased. Accordingly, a material cost may be reduced.

A gap W1 between the pixels PX, a gap W2 between the pixel PX and the bank groove GR, and a gap W3 between the bank grooves GR may be in the range of about 14 μm to about 20 μm or about 10 μm to about 30 μm. In this case, a width of the protrusion PT disposed in each of the gaps may be in the range of about 14 μm to about 20 μm or about 10 μm to about 30 μm. For example, each of the width of the protrusion PT positioned between the pixels PX, the width of the protrusion PT positioned between the pixel PX and the bank groove GR, and the width of the protrusion PT positioned between the bank grooves GR may be in the range of about 14 μm to about 20 μm or 1 about 0 μm to about 30 μm. In this case, the width of the protrusion PT may denote an average width of the protrusions in the corresponding gaps.

The gap W1 between the pixels PX may be smaller than the gap W2 between the pixel PX and the bank groove GR and the gap W3 between the bank grooves GR. When the print head which prints the ink in the openings OP of the pixels PX moves in the first direction DR1, the ink may be suppressed or prevented from missetting in the light-blocking area BA, and a bonding defect or the like between the first display substrate 10 and the second display substrate 20 may be suppressed or prevented. Accordingly, reliability of the display device 1 (see FIG. 1) may be improved.

However, the present disclosure is not limited thereto. For example, all of the gap W1 between the pixels P, the gap W2 between the pixel PX and the bank groove GR, and the gap W3 between the bank grooves GR may be the same.

Hereinafter, another embodiment will be described. In the embodiment below, descriptions of components which are the same as those described above may be omitted or simplified, and differences therebetween will be mainly described.

Figure 8:
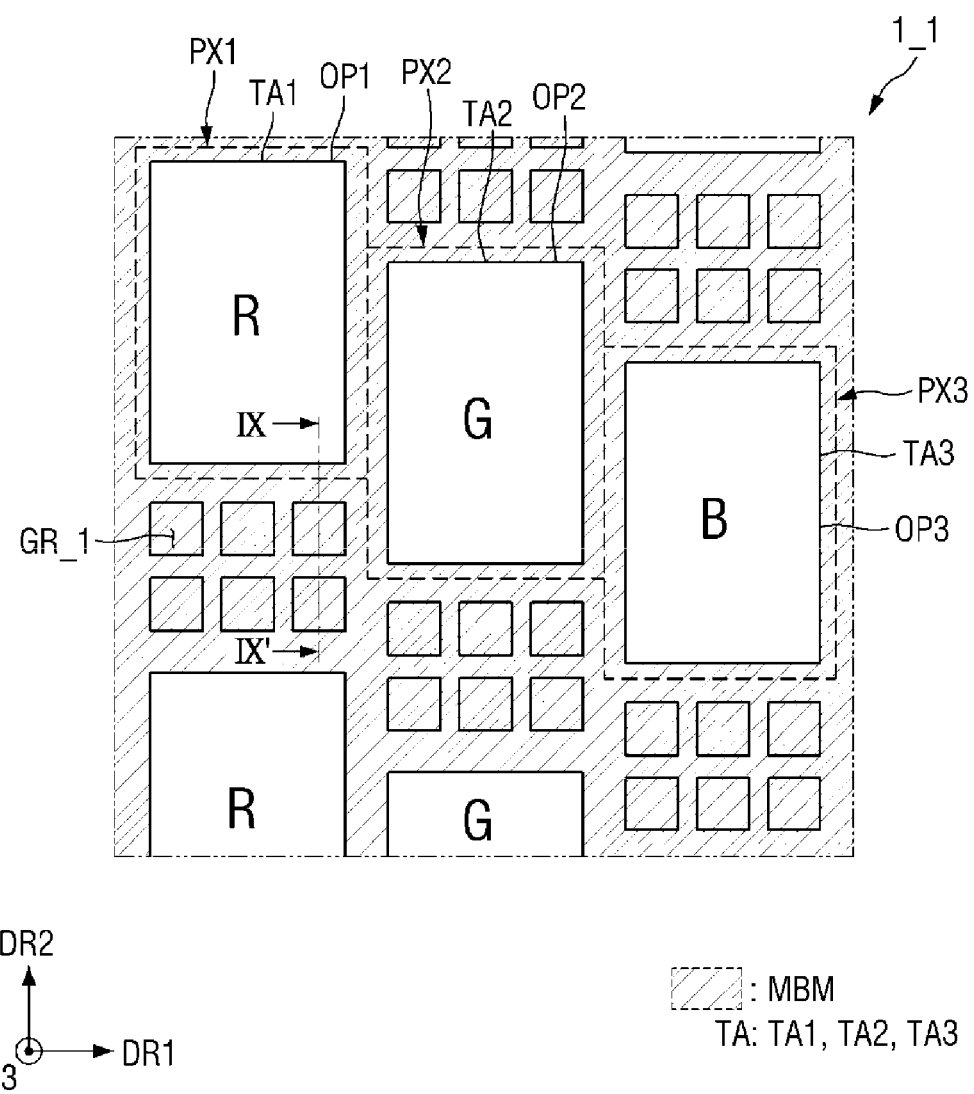
FIG. 8 is a schematic layout showing pixel arrangement and bank groove arrangement of a display device according to another embodiment.
Figure 9:
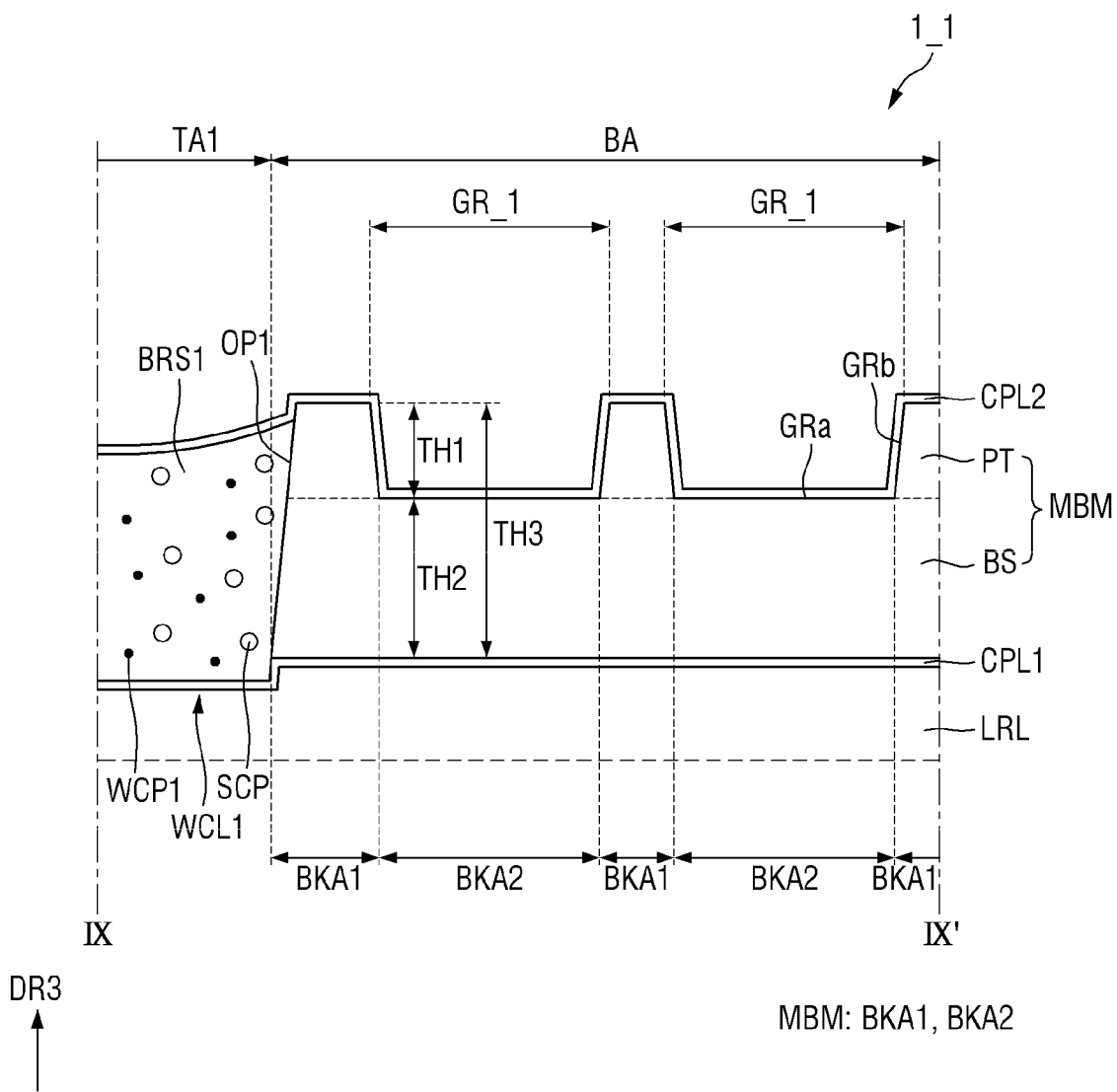
FIG. 9 is a cross-sectional view taken along line IX-IX' of FIG. 8.

FIG. 8 is a schematic layout showing pixel arrangement and bank groove arrangement of a display device according to another embodiment. FIG. 9 is a cross-sectional view taken along line IX-IX' of FIG. 8.

Referring to FIGS. 8 and 9, there is a difference from the embodiment of FIG. 5 in that a plurality of bank grooves GR_1 are disposed between pixels PX of a display device 1_1 according to the present embodiment. The plurality of bank grooves GR_1 disposed at at least any one between first pixels PX1 adjacent to each other, between first pixels PX2 adjacent to each other, and between third pixels PX3 adjacent to each other may be provided. In other words, a first bank area BKA1 may include a mesh pattern at at least any one between the first pixels PX1 adjacent to each other, between the second pixels PX2 adjacent to each other, and the third pixels PX3 adjacent to each other. In addition, when viewed from above, a shape of the bank grooves GR_1 may be defined by the mesh pattern. For example, six bank grooves GR_1 are illustrated as being disposed between the first pixels PX1 adjacent to each other, but the present disclosure is not limited thereto.

In this case, an area of one bank groove GR_1 is in the range of about 1200 μm² to about 7200 μm² or about 600 μm² to about 14400 μm² when viewed from above but is not limited thereto. In addition, a volume of one bank groove GR_1 may be in the range of about 5000 μm³ to about 7000 μm³, be about 6000 μm³, or be in the range of about 4000 μm³ to about 8000 μm³.

In the case in which the area of one bank groove GR_1 satisfies the above-described range when viewed from above, even when a first thickness TH1 of a protrusion PT is in the range of less than ½ or ⅔ of a third thickness TH3 of the bank layer MBM, one bank groove GR_1 may accommodate one ink drop which is misset. The area of one bank groove GR_1 when viewed from above may be adjusted according to the first thickness TH1 of the protrusion PT and the third thickness TH3 of the bank layer MBM.

Even in this case, since the bank groove GR_1 is disposed, a bonding defect due to missetting ink may be suppressed or prevented, and the protrusion PT may be suppressed or prevented from being lost. In addition, even when the protrusion PT is lost, a decrease in thickness of the color control pattern CCL (see FIG. 3) of each of the pixels PX1, PX2, and PX3 may be suppressed or prevented.

In addition, since the plurality of bank grooves GR_1 are disposed between the pixels PX1, PX2, and PX3, a decrease in thickness of the color control pattern CCL (see FIG. 3) of each of the pixels PX1, PX2, and PX3 may be further suppressed or prevented.

Figure 10:
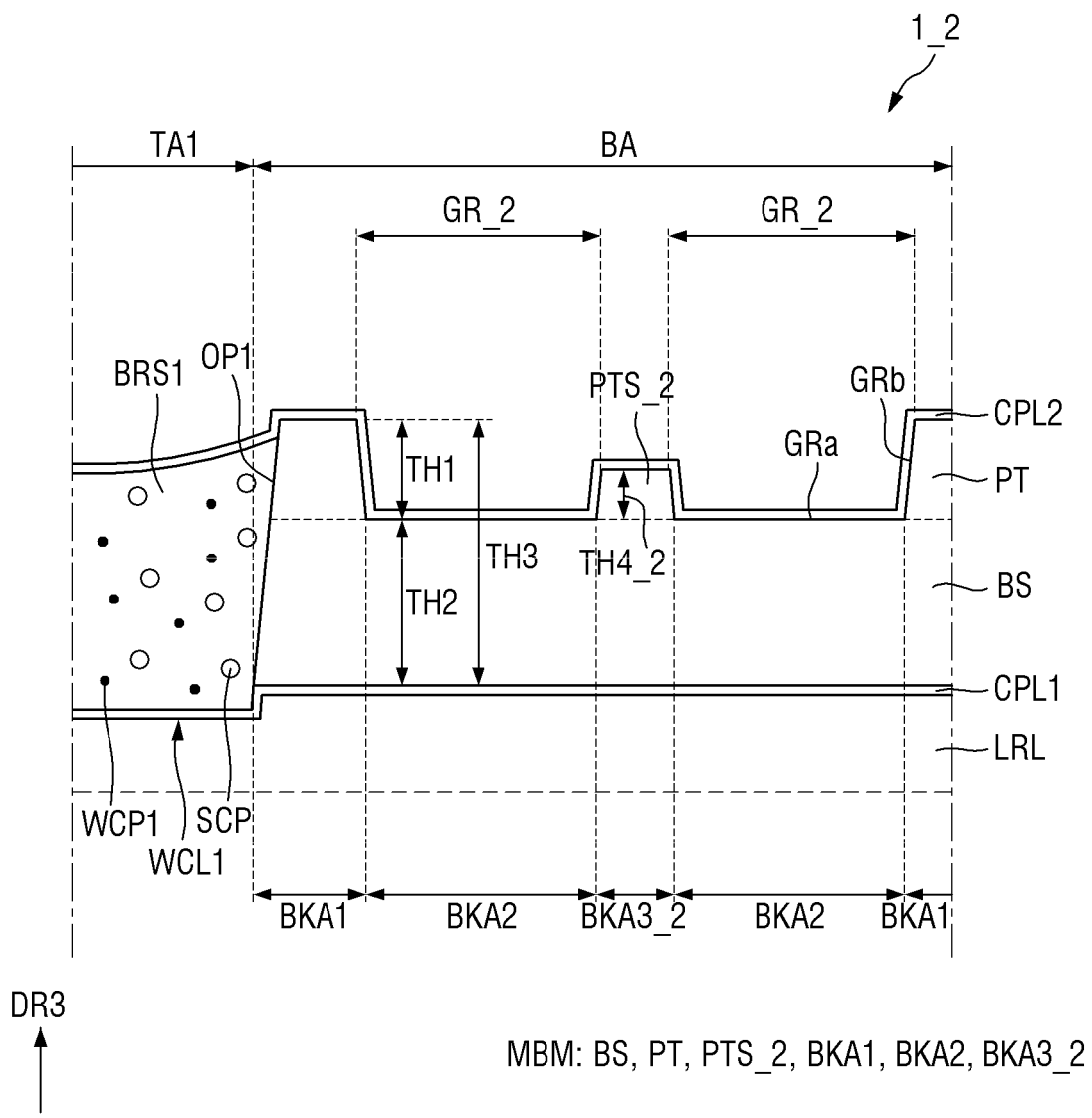
FIG. 10 is a cross-sectional view illustrating a display device according to still another embodiment.

FIG. 10 is a cross-sectional view illustrating a display device according to still another embodiment.

Referring to FIG. 10, in a display device 1_2 according to the present embodiment, there is a difference from the embodiment of FIG. 9 in that a sub-protrusion PTS_2 having a thickness smaller than a thickness of a protrusion PT is disposed between bank grooves GR_2 positioned between pixels PX1, PX2, and PX3.

Specifically, a bank layer MBM may further include the sub-protrusion PTS_2, and a thickness TH4_2 of the sub-protrusion PTS_2 may be smaller than a first thickness TH1 of the protrusion PT. The thickness TH4_2 of the sub-protrusion PTS_2 may be in the range of 1/5 to 4/5 or 1/10 to 9/10 of the first thickness TH1 of the protrusion PT but is not limited thereto.

In this case, the bank layer MBM may further include a third bank area BKA3_2. The third bank area BKA3_2 may be disposed between second bank areas BKA2 adjacent to each other. A base BS and the sub-protrusion PTS_2 of the bank layer MBM may be disposed in the third bank area BKA3_2.

Similar to six bank grooves GR_1 shown in FIG. 8, Six bank grooves GR_2 disposed between first pixels PX1 may be divided by the sub-protrusion PTS_2. Six bank grooves GR_2 disposed between second pixels PX2 may be divided by the sub-protrusion PTS_2. Six bank grooves GR_2 disposed between third pixels PX3 may be divided by the sub-protrusion PTS_2.

Even in this case, since the bank groove GR_2 is disposed, a bonding defect due to missetting ink may be suppressed or prevented, and the protrusion PT may be suppressed or prevented from being lost. In addition, even when the protrusion PT is lost, a decrease in thickness of a color control pattern CCL (see FIG. 3) of each of the pixels PX1, PX2, and PX3 may be suppressed or prevented.

In addition, since the thickness TH4_2 of the sub-protrusion PTS_2 is smaller than the first thickness TH1 of the protrusion PT, the sub-protrusion PTS_2 may be further suppressed or prevented from being lost, and ink or the color control pattern CCL (see FIG. 3) may be further suppressed or prevented from flowing between the bank grooves GR_2 adjacent to each other.

Figure 11:
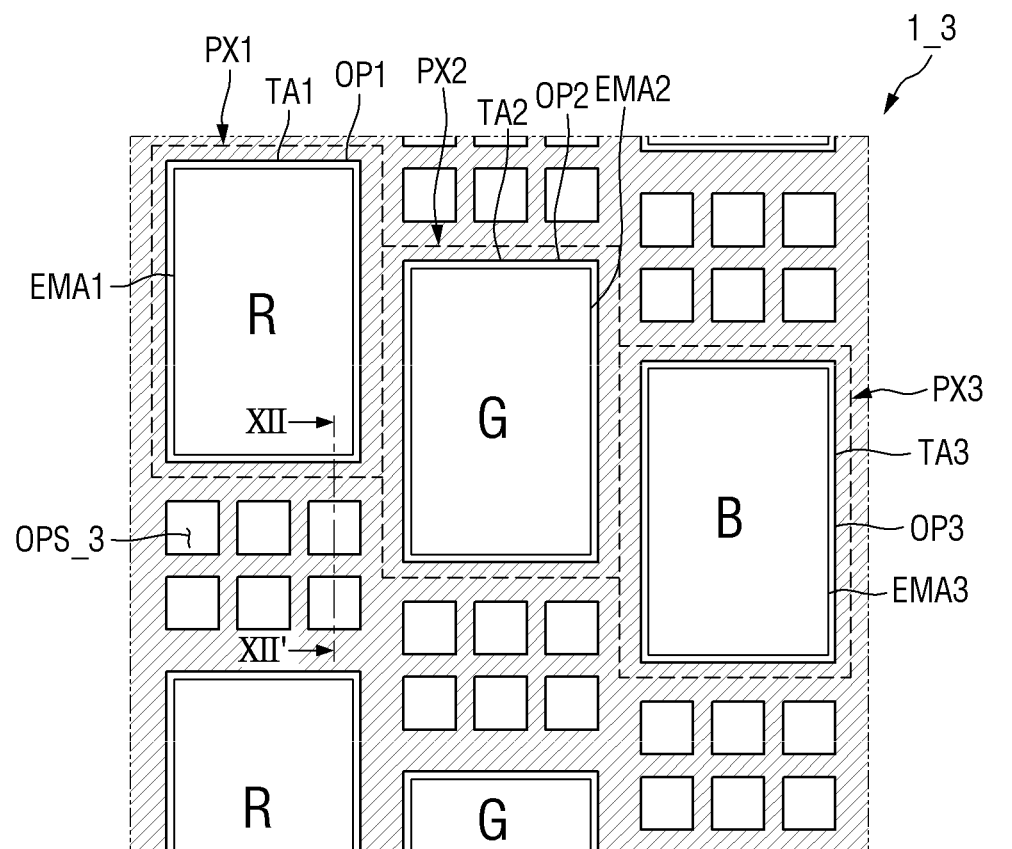
FIG. 11 is a schematic layout showing pixel arrangement and bank groove arrangement of a display device according to yet another embodiment.
Figure 12:
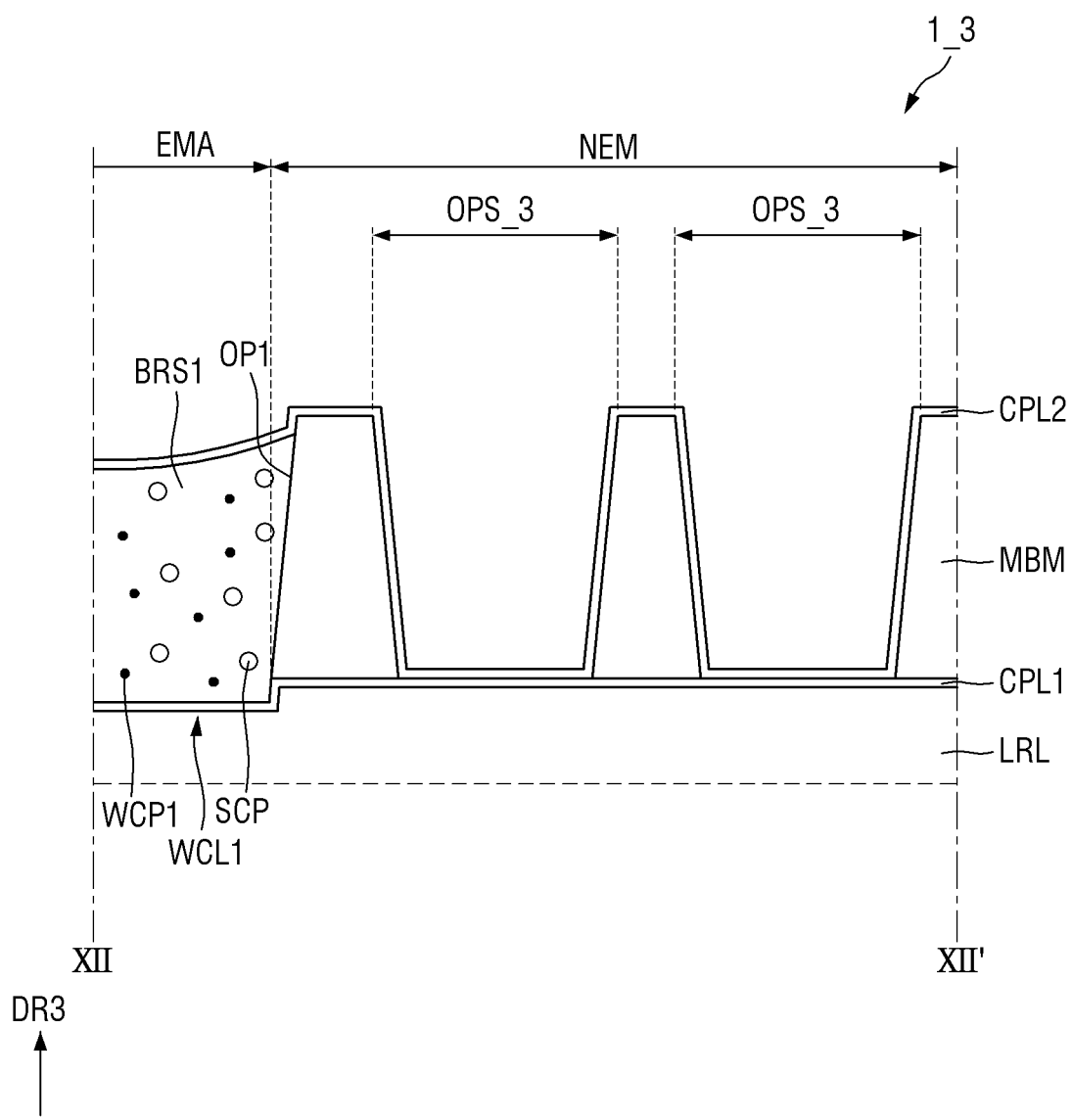
FIG. 12 is a cross-sectional view taken along line XII-XII' of FIG. 11.

FIG. 11 is a schematic layout showing pixel arrangement and bank groove arrangement of a display device according to yet another embodiment. FIG. 12 is a cross-sectional view taken along line XII-XII' of FIG. 11.

Referring to FIGS. 11 and 12, there is a difference from the embodiment of FIG. 8 in that a display device 1_3 according to the present embodiment may further include sub-openings OPS_3 disposed between pixels PX1, PX2, and PX3 as well as first, second, and third openings OP1, OP2, and OP3 disposed in the pixels PX1, PX2, and PX3.

Specifically, the plurality of sub-openings OPS_3 instead of the bank grooves GR_1 of FIG. 8 is defined in the display device 1_3 according to the present embodiment. The sub-openings OPS_3 may be defined by a bank layer MBM and pass through the bank layer MBM in the thickness direction. In this case, a first capping layer CPL1 may be in direct contact with a second capping layer CPL2 through the sub-openings OPS_3 but is not limited thereto. When viewed from above, the arrangement and a shape of the sub-openings OPS_3 may be substantially the same as those of the bank grooves GR_1 of FIG. 8. The pixels PX1, PX2, and PX3 may include light-emitting areas EMA (EMA1, EMA2, and EMA3), and the sub-openings OPS_3 may be disposed in a non-light-emitting area NEM. In this case, the bank layer MBM disposed in the non-light-emitting area NEM may include a mesh pattern, and the sub-openings OPS_3 may be defined by the mesh pattern.

Even in this case, since the sub-openings OPS_3 are disposed, a bonding defect due to missetting ink may be suppressed or prevented. In addition, since the bank layer MBM which defines the sub-openings OPS_3 incudes the mesh pattern, even when the sub-openings OPS_3 are disposed between the first to third openings OP1, OP2, and OP3, the bank layer MBM which defines the first, second, and third openings OP1, OP2, and OP3 may be easily supported. Accordingly, the bank layer MBM which defines the first, second, and third openings OP1, OP2, and OP3 may be suppressed or prevented from being lost.

In addition, since the sub-opening OPS_3 is disposed instead of the bank groove GR_1, (see FIG. 8), the sub-opening OPS_3 has a volume greater than a volume of the bank groove GR_1 in the same area, and ink or a color control pattern CCL (see FIG. 3) may be suppressed or prevented from overflowing.

Figure 13:
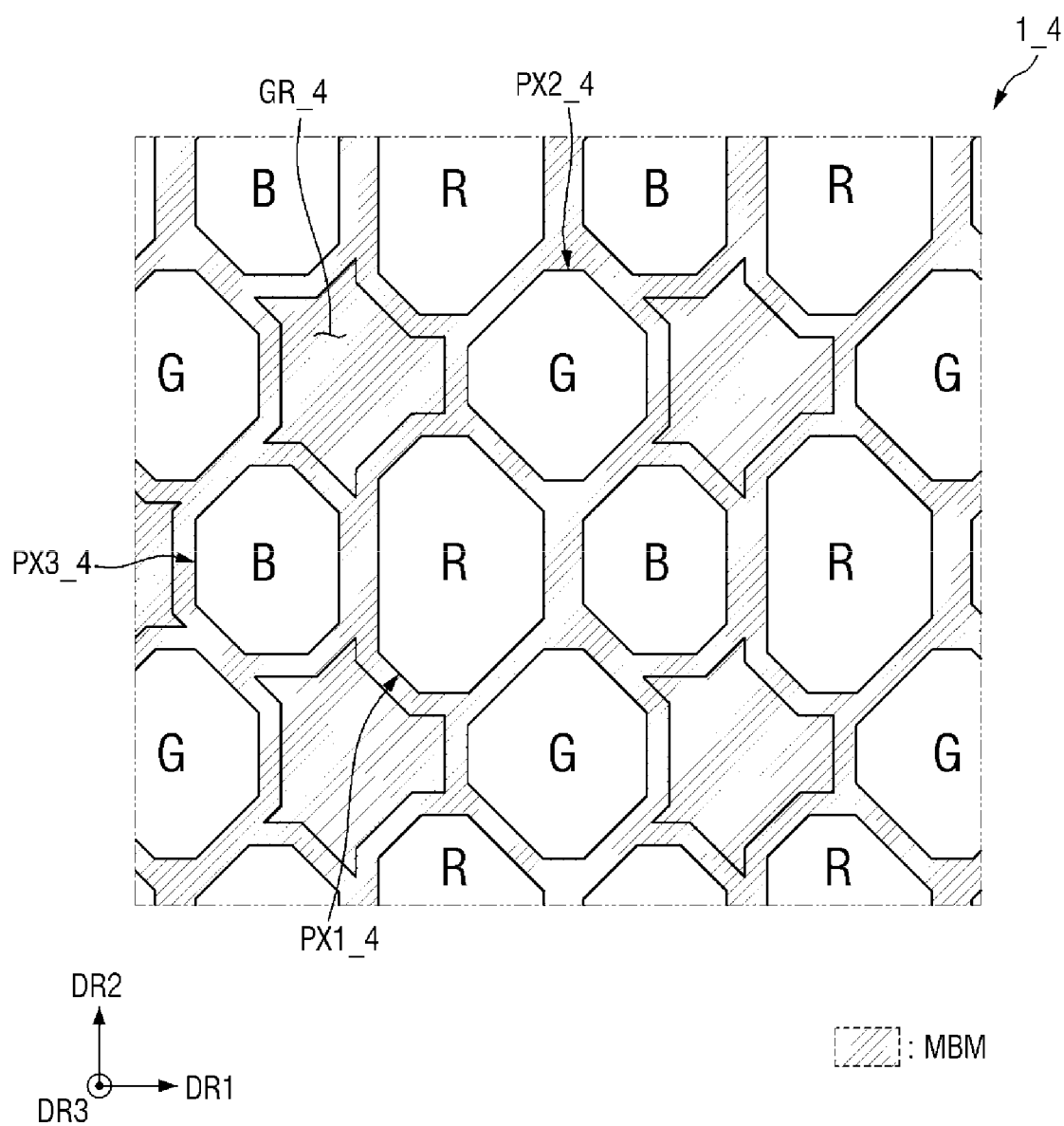
FIG. 13 is a schematic layout showing pixel arrangement and bank groove arrangement of a display device according to yet another embodiment.

FIG. 13 is a schematic layout showing pixel arrangement and bank groove arrangement of a display device according to yet another embodiment.

Referring to FIG. 13, there is a difference from the embodiment of FIG. 4 in that pixels PX1_4, PX2_4, and PX3_4 and bank grooves GR_4 of a display device 1_4 according to the present embodiment may have various shapes when viewed from above. When viewed from above, the pixels PX1_4, PX2_4, and PX3_4 may have octagonal shapes, and all of the shapes of the pixels PX1_4, PX2_4, and PX3_4 may be different when viewed from above.

First pixel PX1_4 and thirds pixel PX3_4 may be alternately repeated in a first direction DR1. Second pixels PX2_4 may be repeatedly disposed in the first direction DR1 at one sides and the other sides, in the direction DR2 of the first pixels PX1_4 and the third pixels PX3_4. The second pixels PX2_4 may form a row (extending in the first direction DR1) which is different from rows of the first pixels PX1_4 and the third pixels PX3_4.

The bank grooves GR_4 may be disposed between the second pixels PX2_4 repeatedly disposed in the first direction DR1. However, an area of the bank groove GR_4 may be disposed between the first pixels PX1_4 and the second pixels PX2_4 which are disposed in the first direction DR1. When viewed from above, the bank groove GR_4 may have an octagonal shape and may further have a shape of which some portions protrude between an upper side and a left side and between a lower side and the left side in the drawing from the octagonal shape. However, the shape of the bank groove GR_4 is not limited thereto when viewed from above.

Even in this case, since the bank groove GR_4 is disposed, a bonding defect due to missetting ink may be suppressed or prevented, and a protrusion PT (see FIG. 6) may be suppressed or prevented from being lost. In addition, even when the protrusion PT (see FIG. 6) is lost, a decrease in thickness of a color control pattern CCL (see FIG. 3) of each of the pixels PX1_4, PX2_4, and PX3_4 may be suppressed or prevented.

Figure 14:
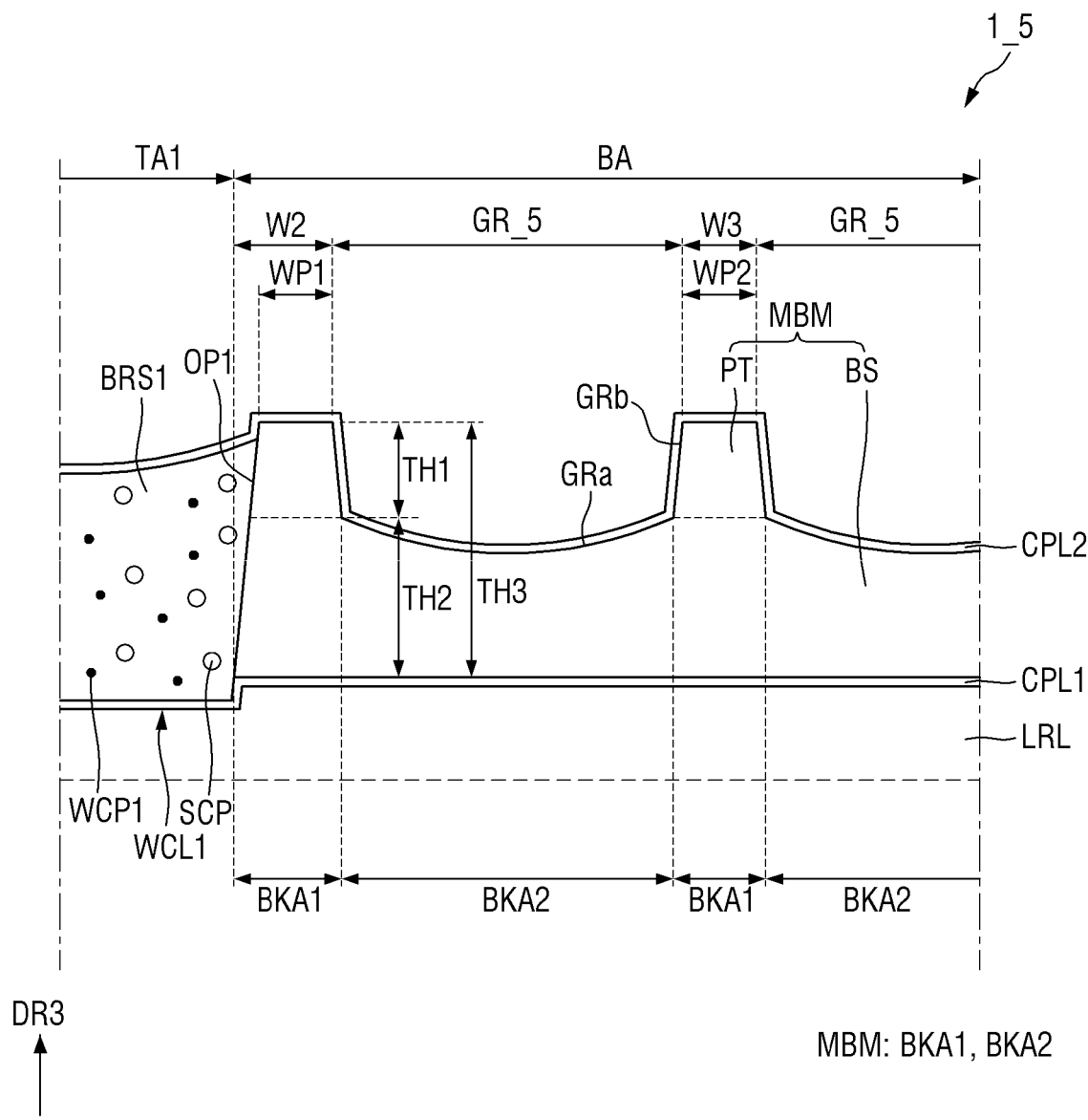
FIG. 14 is a cross-sectional view illustrating a display device according to yet another embodiment.

FIG. 14 is a cross-sectional view illustrating a display device according to yet another embodiment.

Referring to FIG. 14, there is a difference from the embodiment of FIG. 6 in that a bottom surface GRa of a bank groove GR_5 of a display device 1_5 according to the present embodiment has a concave shape. In other words, in one surface (upper surface in FIG. 14 and lower surface in FIG. 3) of a bank layer MBM of the display device 1_5, at least one area may have a curved line. For example, one surface of the bank layer MBM defining the bottom surface GRa of the bank groove GR_5 may have a shape which is concave in a direction toward the other surface (lower surface in FIG. 14 and upper surface in FIG. 3) of the bank layer MBM.

Even in this case, since the bank groove GR_5 is disposed, a bonding defect due to missetting ink may be suppressed or prevented, and a protrusion PT may be suppressed or prevented from being lost. In addition, even when the protrusion PT is lost, a decrease in thickness of a color control pattern CCL (see FIG. 3) of each of pixels PX1, PX2, and PX3 (see FIG. 5) may be suppressed or prevented.

In addition, since the bank groove GR_5 may have one of various shapes, the bank groove GR_5 may be applied to various display devices, and the shape of the bank groove GR_5 may be changed as necessary.

Figure 15:
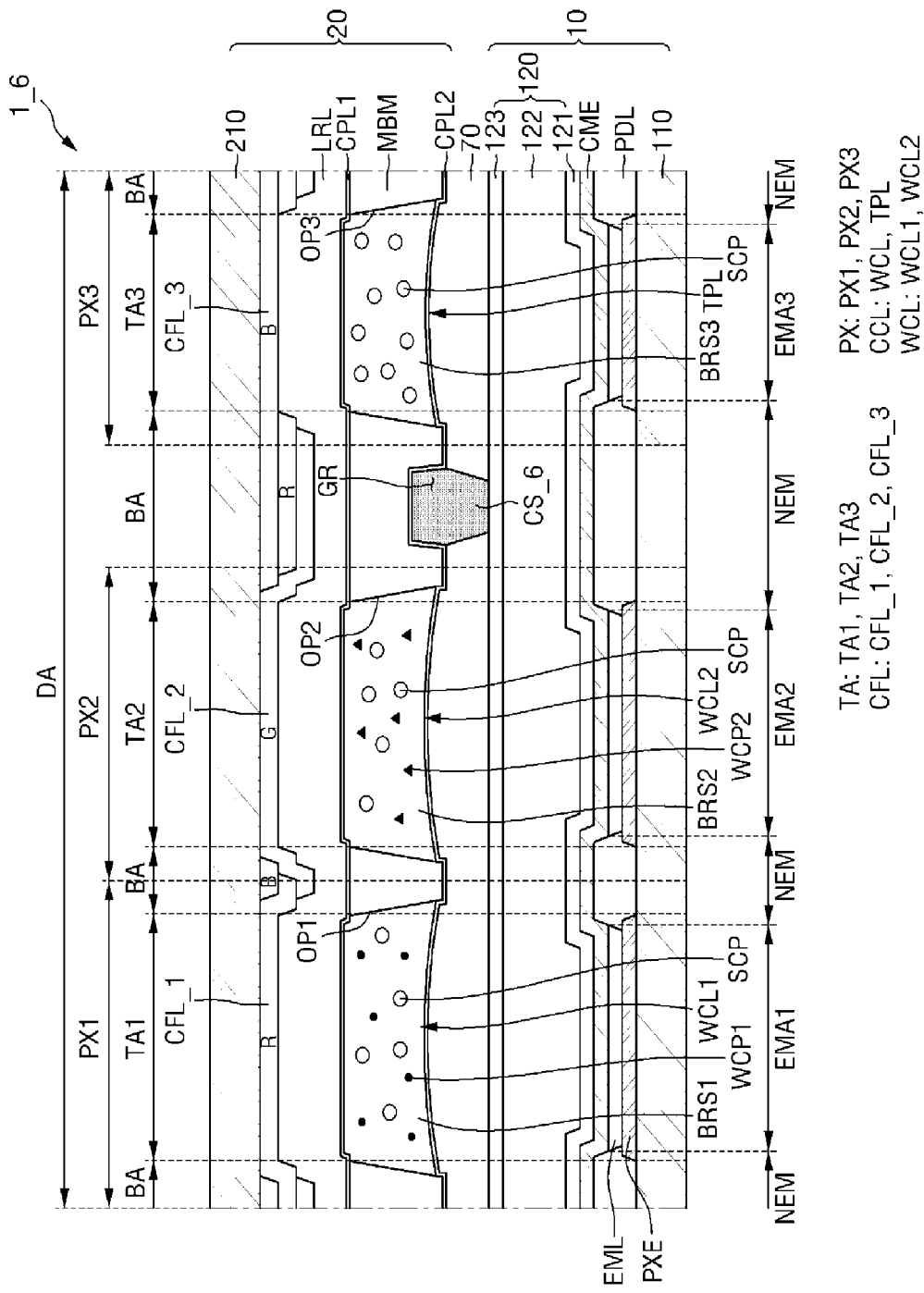
FIG. 15 is a cross-sectional view illustrating a display device according to yet another embodiment.

FIG. 15 is a cross-sectional view illustrating a display device according to yet another embodiment.

Referring to FIG. 15, there is a difference from the embodiment of FIG. 3 in that a display device 1_6 according to the present embodiment further includes a spacer CS_6, and the spacer CS_6 is disposed in a bank groove GR.

Specifically, the display device 1_6 may further include a spacer CS_6. The spacer CS_6 may be disposed in the bank groove GR, and at least a portion thereof may protrude downward from one surface (lower surface in FIG. 3) of a bank layer MBM. The spacer CS_6 may be disposed on a second capping layer CPL. That is, the second capping layer CPL may be disposed between the spacer CS_6 and the bank layer MBM. The spacer CS_6 may be in direct contact with a thin film encapsulation structure 120 of a second display substrate 20 but is not limited thereto. The spacer CS_6 may serve to maintain a cell gap between a first display substrate 10 and the second display substrate 20.

Even in this case, since the bank groove GR_6 is disposed, a bonding defect due to missetting ink may be suppressed or prevented, and a protrusion PT (see FIG. 6) may be suppressed or prevented from being lost. In addition, even when the protrusion PT (see FIG. 6) is lost, a decrease in thickness of a color control pattern CCL of each of pixels PX1, PX2, and PX3 may be suppressed or prevented.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device having a plurality of light-output areas through which incident light is emitted and a light-blocking area which blocks the incident light, the display device comprising:
   a substrate including a first substrate and a second substrate facing the first substrate;
   a pixel definition layer disposed on the first substrate and comprising a first opening corresponding to one of the plurality of light-output areas;
   a light emitting layer disposed on the first substrate and between a pixel electrode and a common electrode;
   a bank layer which is disposed in the light-blocking area disposed on the second substrate and defines a plurality of openings, each of which is disposed in the one of the plurality of light-output areas; and
   a plurality of color control patterns disposed in the plurality of openings of the bank layer and disposed on the second substrate,
   wherein the bank layer includes a first bank area which has a first thickness in a thickness direction and defines the plurality of openings and a second bank area which is disposed between the plurality of openings and has a second thickness in the thickness direction,
   wherein the second thickness is smaller than the first thickness,
   wherein the first bank area and the second bank area in the bank layer are disposed on the second substrate facing the first substrate, and
   wherein the second bank area is disposed between two adjacent openings arranged along a first direction and including color control patterns emitting a same color of light, and is not disposed between two adjacent openings arranged along a second direction and including color control patterns emitting different colors of lights.

2. The display device of claim 1, wherein the bank layer further includes a base and a protrusion protruding from the base,
   wherein the base is disposed in the first bank area and the second bank area, and
   the protrusion is disposed in the first bank area.

3. The display device of claim 2, wherein the bank layer further includes a plurality of bank grooves which are recessed from one surface of the bank layer in the thickness direction and spaced apart from each other when viewed from above.

4. The display device of claim 3, wherein the bank groove is defined by one surface of the base and a side surface of the protrusion extending from the one surface of the base.

5. The display device of claim 2, wherein a thickness of the protrusion is in the range of $1/1000$ to $2/3$ of a thickness of the bank layer.

6. The display device of claim 2, wherein one surface of the base has a concave shape toward the second substrate.

7. The display device of claim 1, wherein:
   the bank layer further includes bank grooves recessed from one surface toward the other surface thereof, and
   the opening and the bank groove are alternately and repeatedly disposed in a first direction when viewed from above.

8. The display device of claim 7, wherein the bank layer is disposed between the opening and the bank groove which are alternately and repeatedly disposed in the first direction.

9. The display device of claim 7, further comprising a spacer disposed in the bank groove,
   wherein at least a portion of the spacer protrudes outward from the bank layer.

10. The display device of claim 1, wherein:
    a thickness of the bank layer in the first bank area is in the range of 6 μm to 14 μm; and
    a thickness of the bank layer in the second bank area is in the range of 3 μm to 7 μm.

11. The display device of claim 1, wherein the light-blocking area surrounds each of the plurality of light-output areas.

12. The display device of claim 1, further comprising:
    a first color filter layer which is disposed on the substrate and allows light of a first color to pass therethrough selectively;
    a second color filter layer which allows light of a second color, which is different from the first color, to pass therethrough selectively; and
    a third color filter layer which allows light of a third color, which is different from the first color and the second color, to pass therethrough selectively,
    wherein the first color filter layer, the second color filter layer, and the third color filter layer overlap in the light-blocking area.

13. The display device of claim 12, wherein each of the plurality of openings overlap a corresponding one of the first color filter layer, the second color filter layer, and the third color filter layer.

14. The display device of claim 13, wherein, in the light-blocking area, the second color filter layer is disposed on the first color filter layer, the third color filter layer is disposed on the second color filter layer, the first color is blue, the second color is red, and the third color is green.

15. A display device having a plurality of light-emitting areas from which light is emitted and a non-light-emitting area which surrounds the light-emitting areas, the display device comprising:
 a substrate including a first substrate and a second substrate facing the first substrate;
 a pixel definition layer disposed on the first substrate and comprising a first opening corresponding to one of the plurality of light-emitting areas;
 a light emitting layer disposed on the first substrate and between a pixel electrode and a common electrode;
 a bank layer disposed in the plurality of non-light-emitting areas of the second substrate and defines a plurality of openings and sub-openings; and
 color control patterns disposed in the plurality of openings in the bank layer and disposed on the second substrate,
 wherein each of the plurality of openings is disposed in the one of the plurality of light-emitting areas,
 wherein each of the sub-openings is disposed in the non-light-emitting area,
 wherein each of the sub-openings in the bank layer is disposed on the second substrate facing the first substrate, and
 wherein the sub-openings are disposed between the plurality of openings adjacent to each other.

16. The display device of claim 15, wherein
the sub-openings are provided to be separated from each other.

17. The display device of claim 16, wherein the bank layer defining the sub-openings includes a mesh pattern.

18. A display device comprising:
 a substrate including a first substrate and a second substrate facing the first substrate;
 a pixel definition layer disposed on the first substrate and comprising a first opening corresponding to one of the plurality of light-output areas;
 a light emitting layer disposed on the first substrate and between a pixel electrode and a common electrode;
 a bank layer which is disposed on the second substrate and includes a plurality of openings passing therethrough in a thickness direction and a plurality of bank grooves recessed from one surface toward the other surface of the bank layer in the thickness direction; and
 a plurality of color control patterns disposed in the plurality of openings in the bank layer and disposed on the second substrate,
 wherein each of the plurality of bank grooves is disposed between two adjacent openings arranged along a first direction and including color control patterns emitting a same color of light, and is not disposed between two adjacent openings arranged along a second direction and including color control patterns emitting different colors of lights,
 wherein the plurality of openings is disposed to be spaced apart from each other when viewed from above, and the plurality of bank grooves is disposed to be spaced apart from each other when viewed from above, and
 wherein the plurality of bank grooves in the bank layer is disposed on the second substrate facing the first substrate.

19. The display device of claim 18, wherein the bank layer is disposed between the opening and the bank groove alternately and repeatedly disposed in the first direction.

20. The display device of claim 19, wherein the bank layer further includes:
 a base; and
 a protrusion protruding from the base,
 wherein the plurality of bank grooves are defined by one surface of the base and a side surface of the protrusion extending from the one surface of the base.

21. The display device of claim 20, wherein the protrusion and a portion of the base, which are integrally formed, are disposed between the opening and the bank groove which are alternately and repeatedly disposed in the first direction.

22. The display device of claim 18, further comprising:
 a plurality of light-output areas through which incident light is emitted; and
 light-blocking areas which block the incident light,
 wherein the plurality of openings are disposed in the light-output areas, and
 the plurality of bank grooves are disposed in the light-blocking areas.

* * * * *